(12) United States Patent
Dent

(10) Patent No.: US 6,311,046 B1
(45) Date of Patent: Oct. 30, 2001

(54) LINEAR AMPLIFICATION SYSTEMS AND METHODS USING MORE THAN TWO CONSTANT LENGTH VECTORS

(75) Inventor: Paul Wilkinson Dent, Pittsboro, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/209,104

(22) Filed: Dec. 10, 1998

Related U.S. Application Data

(63) Continuation-in-part of application No. 09/054,063, filed on Apr. 2, 1998, and a continuation-in-part of application No. 09/054,060, filed on Apr. 2, 1998.

(51) Int. Cl.$^7$ ..................................................... H04B 1/02
(52) U.S. Cl. ............................. 455/91; 455/42; 455/102; 455/13.4; 455/127; 455/522
(58) Field of Search .................................... 455/102, 103, 455/115, 126, 91, 13.4, 127, 129, 116, 139, 140, 141, 108, 118, 42, 110, 522; 330/124 R, 295, 84, 151, 286; 332/144; 375/295, 261, 298, 269, 280, 308

(56) References Cited

U.S. PATENT DOCUMENTS

| | | | |
|---|---|---|---|
| 3,448,366 | 6/1969 | Goff | 363/43 |
| 3,777,275 | 12/1973 | Cox | 330/10 |

(List continued on next page.)

FOREIGN PATENT DOCUMENTS

| | | |
|---|---|---|
| 0 471 346 A1 | 2/1992 | (EP) . |
| 0 598 585 A2 | 5/1994 | (EP) . |
| 0 708 546 A2 | 4/1996 | (EP) . |
| 0 725 478 A1 | 8/1996 | (EP) . |
| 2 267 402 A | 12/1993 | (GB) . |
| WO 97/48219 | 12/1997 | (WO) . |
| WO 99/55206 | 10/1999 | (WO) . |

Primary Examiner—Thanh Cong Le
Assistant Examiner—Yemane Woldetatios
(74) Attorney, Agent, or Firm—Myers Bigel Sibley & Sajovec

(57) ABSTRACT

An input signal of varying amplitude and varying phase is converted into more than two signals of constant amplitude and controlled phase. Each of the more than two signals of constant amplitude and controlled phase is then separately amplified in separate amplifiers. The separately amplified more than two signals of constant amplitude and controlled phase are then combined to produce an output signal that is an amplification of the input signal at the desired power level. When converting the input signal into more than two signals, the phase of each of the more than two signals of constant amplitude and controlled phase is controlled to produce the output signal that is an amplification of the input signal at the desired power level. According to another aspect, a signal of varying amplitude and varying phase is generated from a plurality of constant amplitude varying phase signals, the sum of which is the signal of varying amplitude and varying phase. An IQ waveform generator generates a cosine carrier modulation waveform I(t) and a sine carrier modulation waveform Q(t) from the signal of varying amplitude and varying phase. A function generator generates a complimentary waveform Q'(t) from the cosine carrier modulation waveform I(t) such that the sum of squares of I(t) and Q'(t) is constant. A first modulator modulates a cosine carrier signal with I(t) to obtain a first modulated cosine carrier. A second modulator modulates a sine carrier signal with Q'(t) to obtain a first modulated sine carrier. A circuit such as a butterfly circuit forms the sum and difference of the first modulated cosine carrier and the first modulated sine carrier to obtain the constant amplitude varying phase signals.

51 Claims, 12 Drawing Sheets

U.S. PATENT DOCUMENTS

| | | | |
|---|---|---|---|
| 3,805,139 | 4/1974 | Hoffman, Jr. et al. | 321/5 |
| 3,906,401 | 9/1975 | Seidel | 332/18 |
| 3,909,742 | 9/1975 | Cox et al. | 330/84 |
| 3,927,379 | 12/1975 | Cox et al. | 330/10 |
| 4,090,147 | 5/1978 | Seidel | 330/10 |
| 4,095,196 * | 6/1978 | Seidel | 332/16 T |
| 4,178,557 | 12/1979 | Henry | 330/10 |
| 4,315,107 | 2/1982 | Ciesielka et al. | 179/16 F |
| 4,323,731 * | 4/1982 | Hershberger | 455/114 |
| 4,420,723 | 12/1983 | de Jager | 330/10 |
| 4,433,312 | 2/1984 | Kahn | 332/22 |
| 4,485,357 | 11/1984 | Voorman | 332/17 |
| 4,509,017 | 4/1985 | Andren et al. | 329/105 |
| 4,580,111 | 4/1986 | Swanson | 332/41 |
| 4,672,634 * | 6/1987 | Chung et al. | 375/62 |
| 4,700,390 * | 10/1987 | Machida | 381/29 |
| 4,791,815 | 12/1988 | Yamaguchi et al. | 73/1.37 |
| 4,862,116 | 8/1989 | Olver | 332/23 R |
| 5,077,539 | 12/1991 | Howatt | 330/10 |
| 5,086,450 | 2/1992 | Kitagawa et al. | 379/40 |
| 5,365,187 | 11/1994 | Hornak et al. | 330/10 |
| 5,410,280 | 4/1995 | Linguet et al. | 332/149 |
| 5,420,541 | 5/1995 | Upton et al. | 330/286 |
| 5,438,301 | 8/1995 | Havens et al. | 331/45 |
| 5,453,717 | 9/1995 | Gerfault | 330/146 |
| 5,483,433 | 1/1996 | Yang | 363/43 |
| 5,483,681 | 1/1996 | Bergsten et al. | 455/126 |
| 5,559,468 | 9/1996 | Gailus et al. | 330/110 |
| 5,612,651 | 3/1997 | Chethik | 332/103 |
| 5,682,303 | 10/1997 | Goad | 363/71 |
| 5,694,093 | 12/1997 | DaSilva et al. | 332/103 |
| 5,732,333 | 3/1998 | Cox et al. | 455/126 |
| 5,734,565 | 3/1998 | Mueller et al. | 363/132 |
| 5,767,750 | 6/1998 | Yamaji | 332/103 |
| 5,778,028 | 7/1998 | Kaufmann | 375/296 |
| 5,900,778 | 5/1999 | Stonick et al. | 330/149 |
| 5,930,128 | 7/1999 | Dent | 363/43 |
| 5,990,734 | 11/1999 | Wright et al. | 330/2 |
| 6,204,735 * | 3/2001 | Cairns | 332/119 |
| 6,219,088 * | 4/2001 | Liu et al. | 348/21 |

* cited by examiner

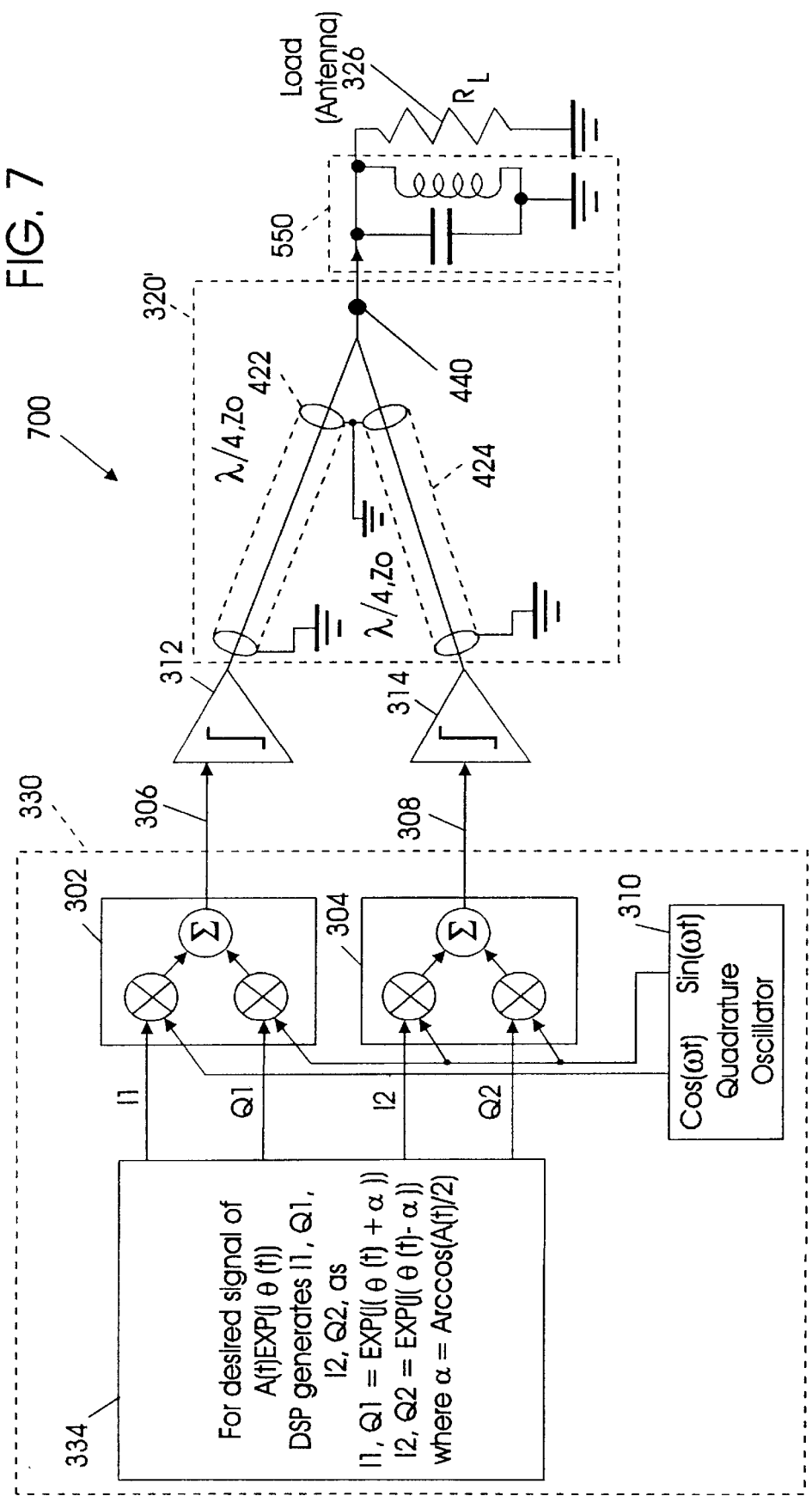

LINEAR AMPLIFICATION SYSTEMS AND METHODS USING MORE THAN TWO CONSTANT LENGTH VECTORS

CROSS REFERENCE TO RELATED APPLICATIONS

This application is a Continuation-in-Part (CIP) of application Ser. No. 09/054,063, filed Apr. 2, 1998, entitled "Hybird Chireix/Doherty Amplifiers and Methods" to the present inventor, assigned to the assignee of the present invention, the disclosure of which is hereby incorporated herein by reference, which itself is related to application Ser. No. 09/054,060, filed Apr. 2, 1998, entitled "Power Waveform Synthesis Using Bilateral Devices" to the present inventor, assigned to the assignee of the present invention, the disclosure of which is hereby incorporated herein by reference.

FIELD OF THE INVENTION

This invention relates to power amplifiers and amplifying methods, and more particularly to high-efficiency power amplifiers and related methods

BACKGROUND OF THE INVENTION

Power amplifiers are widely used in communication systems, for example in radiotelephone base stations and radiotelephones. In radiotelephone communication systems, power amplifiers typically amplify high frequency signals for transmission.

A major consideration in the design of power amplifiers is the efficiency thereof. High efficiency is generally desirable so as to reduce the amount of power that is dissipated as heat. Moreover, in many applications, such as in satellites and portable radiotelephones, the amount of power that is available may be limited. An increase in efficiency in the power amplifier is therefore important, in order to allow an increase the operational time or capacity for the satellite or portable radiotelephone.

A conventional power amplifier such as a class-B amplifier generally only provides maximum efficiency at or near to its maximum saturated power output level. In order to accurately reproduce a signal of varying amplitude, the peak output signal level should be equal to or less than that maximum saturated power level. When the instantaneous signal output level is less than the peak, a conventional class-B power amplifier generally operates at less than maximum efficiency.

The efficiency generally reduces as the square root of the output power. This is because, using the class-B example, the output power reduces as the square of the output current but the power consumption from the battery or other DC supply reduces only proportional to the output current. Therefore, the efficiency, which is the ratio of output power to battery power, reduces proportional to the current, i.e., proportional to the square root of the output power.

Accordingly, a power amplifier that has 60% efficiency at a peak output of 2 watts will generally have no more than 42% efficiency at an output of 1 watt (3 dB reduced output). Moreover, when amplifying a signal of varying amplitude, a conventional amplifier may not produce an output signal amplitude proportional to the input signal amplitude, thereby causing nonlinear distortion and intermodulation.

With a varying output signal power $P(t)=A^2(t)$, the average efficiency can be estimated to be:

$$\text{Max efficiency} \times \frac{\text{average of } (P(t)/P_{max})}{\text{average of square root } (P(t)/P_{max})}$$

$$\text{Max efficiency} \times \frac{\text{average of } (A(t)/A_{max})^2}{\text{average of } (A(t)/A_{max})}.$$

Nonlinearities in conventional amplifiers can be reduced by various techniques, such as by an inverse predistortion of the input signal, or by feedback including Cartesian feedback in radio frequency power amplifiers for linearly amplifying signals with a bandwidth much less than the center frequency. Unfortunately, linearization generally does not alter the above efficiency formula, which in fact already assumes that the output amplitude can be made to faithfully follow the desired varying amplitude waveform. In effect, the average efficiency calculated above already assumes perfect linearization.

The loss of efficiency comes about because current $I(t)$ is drawn from the battery at a constant voltage $V_{cc}$, but is supplied to the load at a varying voltage $I(t) \cdot R_L$ which is less than $V_{cc}$. The voltage difference $V_{cc} - I(t) \cdot R_L$ is lost across the output device (e.g. collector junction), causing power dissipation in the device.

In U.S. Pat. No. 2,210,028 to Doherty (Aug.1940), an arrangement of two vacuum tube power amplifiers coupled by a single quarter-wave line is described. The first amplifier is operated up to an output level of Pmax/4, at which it achieves maximum practical class-B efficiency. For powers above this level, the second amplifier is caused to contribute. The second amplifier affects the load impedance of the first amplifier one quarter wave away such that the first amplifier can increase its power up to Pmax/2, while the second amplifier also contributes up to Pmax/2, making Pmax in total, at which point both amplifiers are once more achieving maximum practical class-B efficiency. Thus, efficiency is preserved over a 6 dB range of output levels from Pmax/4 to Pmax. A semiconductor version of the Doherty amplifier is described in a more recent U.S. Pat. No. 5,420,541 entitled "Microwave Doherty Amplifier" to Upton et al.

In the prior art Doherty amplifier, the "normal" power amplifier amplifies a signal from 0 power to ¼ the peak power level, achieving maximum class-B efficiency at that power level. The peak power amplifier then begins to contribute to the output power and by reducing the effective load impedance seen by the "normal" power amplifier, enables it to generate a greater power output up to half the peak power level. The peak power amplifier also generates half the peak power level so that the two amplifiers jointly produce the desired peak power level. The "peak" power amplifier in this prior art is not operated in antiphase so as to detract from the output power level, and thereby increasing the effective load impedance seen by the "normal" power amplifier and allowing it to generate less power efficiently. Thus the "peak" power amplifier does not operate symmetrically as a "trough" power amplifier.

In Proc. IRE, Vol. 23 No. 11 (1935), pages 1370–1392, entitled "High Power Outphasing Modulation", Chireix describes producing a transmitter giving a modulated amplitude output signal by combining two constant output amplitude amplifiers with a variable phase difference so that their outputs can be varied in relative phase from additive to subtractive. The Chireix and Doherty techniques were not combined to obtain an amplifier of good linearity and high efficiency, as the Doherty amplifier relied on the two constituent amplifiers being co-phased while the Chireix amplifier relied upon them being out-of-phase. When two amplifiers are out-of-phase, as they were in the prior art, they are preferably isolated from one another using a hybrid coupler or directional coupler to combine them. The directional coupler combines the two amplifier's output signals to produce a sum signal and a difference signal, the sum signal being used as the desired output and the difference signal being terminated in a dummy load. Since all the amplifier power ends up at either the sum or the difference port and is not reflected to either amplifier, the amplifiers are isolated from one another and do not affect each other's load line.

In U.S. Pat Nos. 5,568,088; 5,574,967; 5,631,604; and 5,638,024 to applicant Dent, all entitled "Waste Energy Control and Management in Power Amplifiers", various arrangements of coupled power amplifiers are disclosed in which a varying amplitude signal may be produced using constant amplitude power amplifiers. In one arrangement, two constant power amplifiers are driven with a relative phase shift as in Chireix such that their outputs add more or less constructively or destructively to produce a varying output. The amplifiers were coupled at their outputs using a hybrid coupler or directional coupler which forms both a sum signal and a difference signal. An improvement over the prior art described therein comprises recovering the normally wasted energy at the difference port using a rectifier circuit. The Doherty patent, the Chireix paper and the above referenced Dent patents are hereby incorporated by reference herein.

In applicant's 1964 graduate thesis project, an amplifier was built and reported in which the value of Vcc was selected to be either Vcc or 0.7 Vcc based on whether the desired output amplitude was greater or less than 0.7 Vcc. With a pure sine wave drive, this raised the peak efficiency from the theoretical value of $\pi/4$ (~78.5%) for a class-B amplifier to 85.6% for the new amplifier, termed class-BC. The efficiency at half maximum output power was now 78.5% instead of 55% for class-B.

The Vcc selection was effected by using a first pair of transistors connected to the 0.7 Vcc supply to supply load current when the output amplitude was less than 0.7 Vcc, and a second pair of transistors connected to the full Vcc supply for supplying the load current for amplitudes between 0.7 Vcc and Vcc. Diodes were used to protect the first pair of transistors by preventing reverse current flow when the output amplitude was driven above their supply voltage. The above arrangement worked well for audio frequencies where diodes turn on and off sufficiently fast, but may not be effective for microwave frequencies.

Also in the 1960s, many so called "class-D" or pulse-width modulation amplifiers were proposed and manufactured. Pulse-width modulation amplifiers switched the output devices on and off at a high frequency with a mark-space ratio proportional to the instantaneous desired signal waveform. A low-pass output filter smoothed the switching signal to reject the high switching frequency and to produce the mean of the varying mark-space ratio signal as the desired output signal waveform. A disadvantage of the class-D amplifier was the need to switch the output devices at a very much higher frequency than the desired signal to be amplified, which may not be practical when the desired signal is already a high frequency signal such as a microwave signal.

The above survey indicates that many techniques have been used in order to improve the efficiency of power amplifiers. However, notwithstanding these techniques, there continues to be a need for power amplifiers that can operate at high efficiencies at maximum output, and also at outputs that are below maximum output. Moreover, it is desirable for high efficiency power amplifiers to operate with high frequency signals, such as are used in wireless communication systems.

Parent application Ser. No. 09/054,063 describes the coupling two amplifiers that are driven using Chireix outphasing modulation to one another, so that the amplifiers affect each other's effective load line. The two amplifiers can thereby maintain efficiency over a wider dynamic range than in a conventional Doherty amplifier.

More specifically, the parent application provides apparatus that amplifies an AC input signal of varying amplitude and varying phase using a DC power supply. The apparatus includes a converter that converts the AC input signal into a first signal having constant amplitude and a first phase angle and into a second signal having constant amplitude and a second phase angle. A first amplifier amplifies the first signal, and a second amplifier amplifies the second signal. A coupler couples the first and second amplifiers to one another and to a load impedance, such that voltages or currents in the first amplifier become linearly related to voltages or currents in the second amplifier.

In one embodiment, the coupler comprises at least one transformer that serially couples the first and second amplifiers to one another and to the load impedance. In another embodiment, the coupler comprises first and second quarter wave transmission lines that couple the respective first and second amplifiers to one another and to the load impedance.

According to another aspect of the parent application, the first and second amplifiers are first and second bilateral amplifiers, such that current flows from the first and second amplifiers to the DC power supply during part of the signal cycle of the AC input signal, to thereby return energy to the DC power supply. Further increases in efficiency may thereby be obtained.

Accordingly, two coupled amplifiers driven using the outphasing modulation of Chireix can operate identically and can symmetrically affect each other's effective load line so as to efficiently generate both peak and trough power levels and maintain efficiency over a wider dynamic range than in a Doherty amplifier. When the two amplifiers that are not in phase affect each other's load line, current flows from the DC source to the load during part of the signal waveform cycle and flows to the source for another part of the cycle. The mean power consumption from the source can be reduced in the same ratio as the load power is reduced, thus maintaining efficiency. In the Chireix and Doherty disclosures, vacuum tubes of that era were not able to conduct in the reverse direction to return current to the source. In contrast, in the present invention, two amplifiers constructed using bilateral devices are driven by two, separate, preferably digitally synthesized waveforms and their outputs are combined, for example using transformers or two quarter wave lines connected to a harmonic short circuit. Using the parent application, the linearity advantage of Chireix may be obtained together with an even greater efficiency improvement than Doherty's technique.

When two constant amplitude signals are to be combined to produce a varying amplitude, the phase of each signal is varied in the opposite direction to one another. When the phase of the resultant also varied, the desired phase variation is added to the phases of each signal. The direction of phase variation is additive to the amplitudes-varying phase component in the case of one of the signals, and subtractive from the other. Thus, the phase of one signal may need to vary more rapidly.

When a phase locked loop is used to produce the desired varying phases at a desired radio frequency, the loop bandwidth that is needed to follow the more rapidly varying phase therefore may need to be increased. This increase in phase locked loop may allow more undesirable noise amplification.

SUMMARY OF THE INVENTION

It is therefore an object of the invention to provide improved power amplifiers and amplifying methods.

It is another object of the present invention to provide power amplifiers and amplifying methods that are capable of high efficiency.

It is yet another object of the present invention to provide power amplifiers and amplifying methods that are capable of high efficiency at high frequencies.

It is still another object of the present invention to provide power amplifiers and amplifying methods that are capable of high efficiency at levels below their maximum output power.

It is yet another object of the present invention to provide power amplifiers and amplifying methods that need not unduly increase the phase locked loop bandwidth that is used to produce varying phases at a desired high frequency.

These and other objects are provided, according to the present invention by converting an input signal of varying amplitude and varying phase into more than two signals of constant amplitude and controlled phase. Each of the more than two signals of constant amplitude and controlled phase is then separately amplified in separate amplifiers. The separately amplified more than two signals of constant amplitude and controlled phase are then combined to produce an output signal that is an amplification of the input signal at the desired power level. When converting the input signal into more than two signals, the phase of each of the more than two signals of constant amplitude and controlled phase is controlled to produce the output signal that is an amplification of the input signal at the desired power level.

In a preferred embodiment, the more than two signals of constant amplitude and controlled phase are four signals of constant amplitude and controlled phase. The four signals of constant amplitude and controlled phase preferably are a first pair of signals of constant amplitude and controlled phase that combine to produce a first complex part of the output signal and a second pair of signals of constant amplitude and controlled phase that combine to produce a second complex part of the output signal. The phases of the first pair of signals of complex amplitude and controlled phase preferably are controlled to vary in a counter-rotating manner to produce the first complex part of the output signal. The phases of the second pair of signals of complex amplitude and controlled phase preferably are controlled to vary in a counter-rotating manner to produce the second complex part of the output signal. Saturated power amplifiers are preferably used to separately amplify each of the more than two signals of constant amplitude and controlled phase.

In one embodiment, combining takes place by series-combining the separately amplified more than two signals of constant amplitude and controlled phase to produce an output signal that is an amplification of the input signal at the desired power level. Series-combining may take place by using more than two transformers each having a primary winding and a secondary winding. A respective primary winding is coupled to a respective one of the more than two amplifiers. The secondary windings are serially coupled to produce an output signal that is an amplification of the input signal at the desired power level. Alternatively, more than two quarter wavelength transmission lines may be used to combine the signals from the more than two amplifiers. Each transmission line has first and second ends. A respective first end is coupled to a respective one of the more than two amplifiers. The second ends are coupled together to produce an output signal that is amplification of the input signal at the desired power level. Quarter wavelength transmission line equivalent networks also may be used. For example, Pi-networks including capacitors and inductors may be used.

The phase of each of the more than two signals may be controlled by phase modulating, and preferably by quadrature modulating, each of the more than two signals of constant amplitude and controlled phase to produce the output signal that is an amplification of the input signal at the desired power level. Phase modulating preferably takes place using a separate phase locked loop for each of more than two signals of constant amplitude.

According to another aspect of the present invention, a signal of varying amplitude and varying phase is generated from a plurality of constant amplitude varying phase signals, the sum of which is the signal of varying amplitude and varying phase. An IQ waveform generator generates a cosine carrier modulation waveform I(t) and a sine carrier modulation waveform Q(t) from the signal of varying amplitude and varying phase. A function generator generates a complimentary waveform Q'(t) from the cosine carrier modulation waveform I(t) such that the sum of squares of I(t) and Q'(t) is constant. A first modulator modulates a cosine carrier signal with I(t) to obtain a first modulated cosine carrier. A second modulator modulates a sine carrier signal with Q'(t) to obtain a first modulated sine carrier. A circuit such as a butterfly circuit forms the sum and difference of the first modulated cosine carrier and the first modulated sine carrier to obtain the constant amplitude varying phase signals.

A second function generator generates a complimentary waveform I'(t) from the sine carrier modulation waveform Q(t) such that the sum of squares of I'(t) and Q(t) is constant. A third modulator modulates a cosine carrier signal with I'(t) to obtain a second modulated cosine carrier. A fourth modulator modulates a sine carrier signal with Q(t) to obtain a second modulated sine carrier. A second circuit such as a second butterfly circuit forms the sum and difference of the second modulated cosine carrier and the second modulated sine carrier to obtain a second set of constant amplitude varying phase signals.

Accordingly, the present invention combines more than two constant amplitude, varying phase vectors to obtain a given resultant vector, the combined vectors being of more slowly varying phase. In one aspect, four constant amplitude power vectors are combined. A first pair of signal vectors is generated, amplified and combined to produce a constant phase, varying amplitude vector, representing the real part of the desired resultant. A second pair of signal vectors is generated, amplified and combined to produce a second, constant phase, varying amplitude vector representing the desired imaginary part of the resultant, i.e. a vector at right angles to the real part. Each of the four constant amplitude vectors therefore may be limited in the rate of its required phase variation, allowing the use of lower phase locked loop bandwidths.

A preferred implementation uses a first quadrature modulator comprising a cosine and a sine or I and Q modulator to generate an amplitude modulated cosine carrier signal and an amplitude modulated sinewave carrier signal. The modulated cosine and sine signals are then both added and subtracted to generate two counter-rotating, constant-amplitude vectors whose resultant sum is a cosine signal of amplitude equal to a desired real part. The desired real part is the I-modulation applied to the cosine modulator. The Q-modulation is the square root of $(1-I^2)$, which ensures constant amplitude for both I+jQ and I−jQ. A second quadrature modulator modulates a sine carrier with the desired imaginary or Q part of the desired resultant signal while modulating a cosine carrier with the square root of $(1-Q^2)$, thus ensuring that, after forming jQ+I and jQ−I, they are both counter-rotating constant amplitude vectors the sum of which is the desired imaginary part. The four constant-amplitude vectors are then power-amplified, for example by using four phase locked loops to transfer the four varying phases to the output of respective power amplifiers at a desired final frequency for transmission.

Any number of constant-amplitude, varying-phase vectors greater than two, for example three, may be generated in such a way that their resultant sum is a desired varying amplitude, varying phase vector. The desired varying amplitude, varying phase vector has two components specified, being the real and the imaginary part respectively. However, the combination of more than two constant amplitude vectors provides excess degrees of freedom, which may be used according to the invention to choose a solution which can reduce and preferably minimize the maximum rate of change of phase of any vector. This solution may be computed by digital signal processing, either in real time, or alternatively, for digital modulations, can be computed off-line for various combinations of successive modulation symbols and stored in a look-up table for use later in generating signals in real time. Amplification systems and methods may be provided.

BRIEF DESCRIPTION OF THE DRAWINGS

FIG. 7 is a block diagram of a fourth embodiment of power amplifiers according to the parent application.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well.

Figure 1:
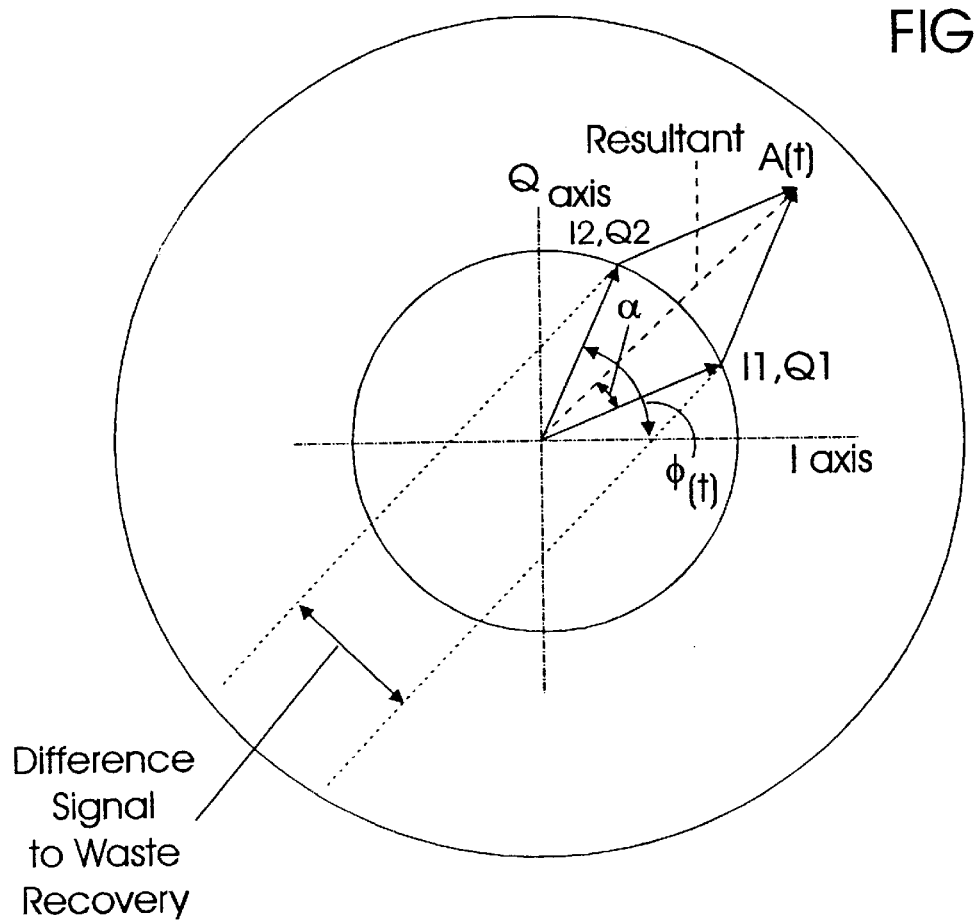
FIG. 1 graphically illustrates vector addition of two constant envelope signals.

FIG. 1 shows how a varying amplitude vector can be constructed by adding two constant amplitude vectors with correct relative phasing, as first proposed by Chireix in his 1935 paper. The inner circle indicates maximum amplitude for one power amplifier, and the outer circle indicates maximum amplitude for two equal power amplifiers. As shown, the desired amplitude is A(t) and the desired phase is $\phi(t)$. This may be obtained using first in-phase and quadrature signals I1 and Q1 and second in-phase and quadrature signals I2 and Q2, where I1=COS($\phi-\alpha$), Q1=SIN($\phi-\alpha$), I2=COS($\phi+\alpha$), and Q2=($\phi+\alpha$), where $\alpha$=ar cos(A/2).

Figure 2:
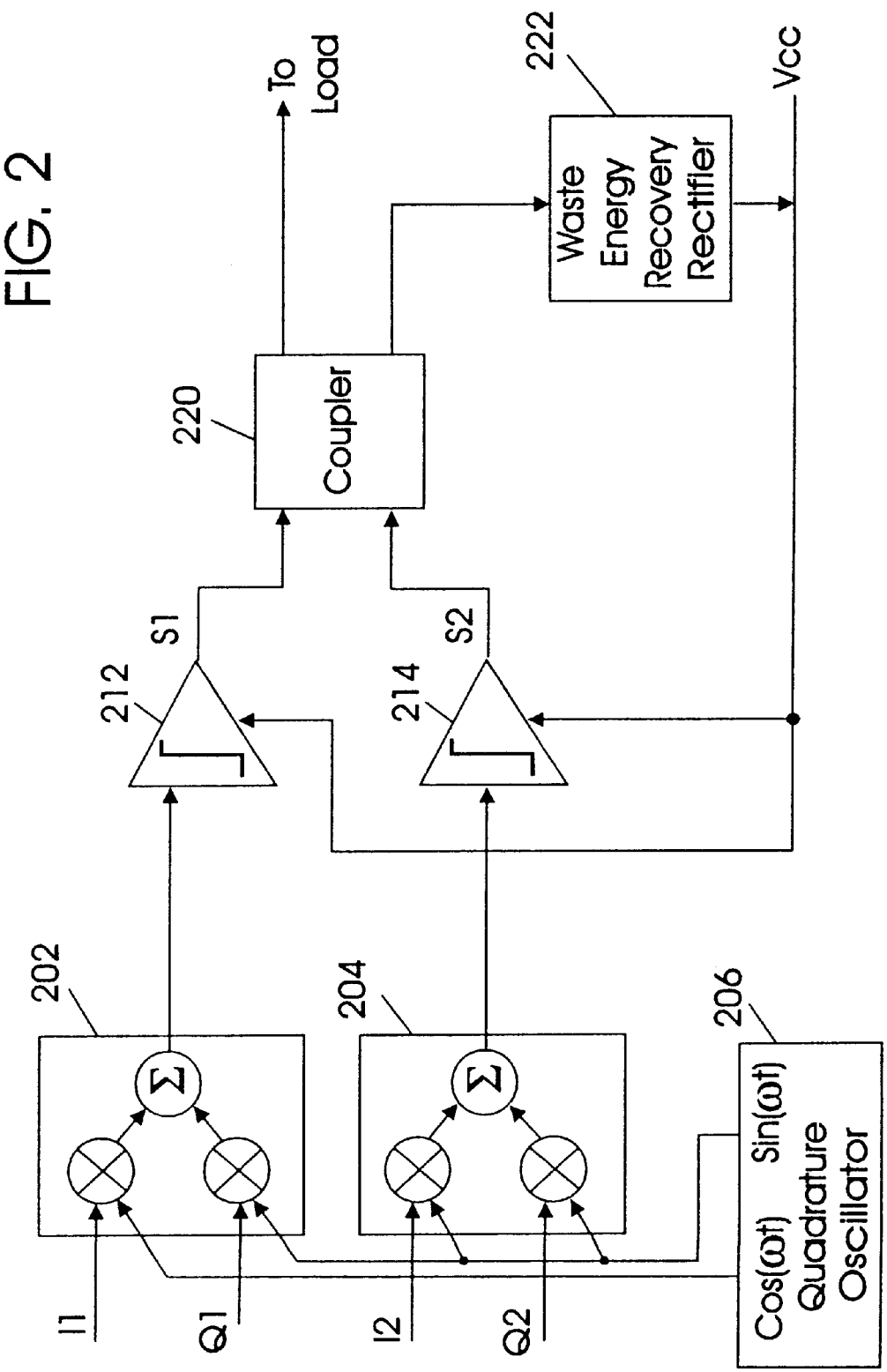
FIG. 2 is a block diagram of a conventional power amplifier using quadrature modulators and a pair of isolated power amplifiers.

In that era, Chireix did not have the benefit of modem digital signal processing technology to accurately generate the two out-phased signals. A modern implementation using two quadrature modulators 202, 204 driven by digitally synthesized vector waveforms I1, Q1, I2, Q2 and a quadrature oscillator 206 is shown in FIG. 2.

The output of the two power amplifiers 212, 214 each being for example, a class-C amplifier of power Pmax/2, can be added using a hybrid or −3 dB directional coupler 220 (coupling factor "k" =0.7071). A hybrid or directional coupler 220 effectively produces a sum and difference signal. Terminating the difference port and the sum port with like impedances gives isolation between the two power amplifiers so that power (voltage or current) from one does not reach the other. The sum signal rises to Pmax when both amplifiers are driven in phase, and falls to zero when they are driven 180 degrees out of phase. In between, the power is Pmax·$\cos^2(\alpha)$ where '$\alpha$' is the relative phasing. The difference output is Pmax·$\sin^2(\alpha)$ and the sum of the outputs is thus always Pmax.

When the desired output P(t) is less than Pmax, the difference Pmax−P(t) comes out the difference port and is normally lost. The average efficiency in this case may be even worse than that calculated above for class-B, as the battery current does not reduce when the output is less than Pmax. On the other hand, there is a possibility that constant envelope amplifiers can be constructed in practice with higher efficiency (at Pmax) than amplifiers with a linearity requirement, so that in practice an advantage may be obtained. However, even if a class-C efficiency of 100% could be obtained, the arrangement would only give 50% efficiency with a peak-to-mean power ratio of 3 dB, and 25% with a peak-to-mean ratio of 6 dB.

To help the efficiency, applicant proposed in the above-incorporated Dent patents to recover the energy normally dissipated at the difference port of the output coupler. A waste energy recovery rectifier 222 is used to rectify the dissipated energy and feed the DC current back to the battery. It is known that very efficient rectifiers can be made even at microwave frequencies, as research on wireless power transmission using microwaves has demonstrated.

For digital modulation signals, it is known that the number of different I and Q waveforms that are needed over a data bit interval can be limited to two to the power of a small number of bits surrounding the current bit, because data bits further removed from a current data bit have negligible effect. Thus the waveforms I1, Q1, I2 and Q2 may be precomputed for all two to the power N combinations of nearby bits and stored in memory, and recalled when needed. In that way, the need to compute arc-cosines in real time may be avoided.

Figure 3:
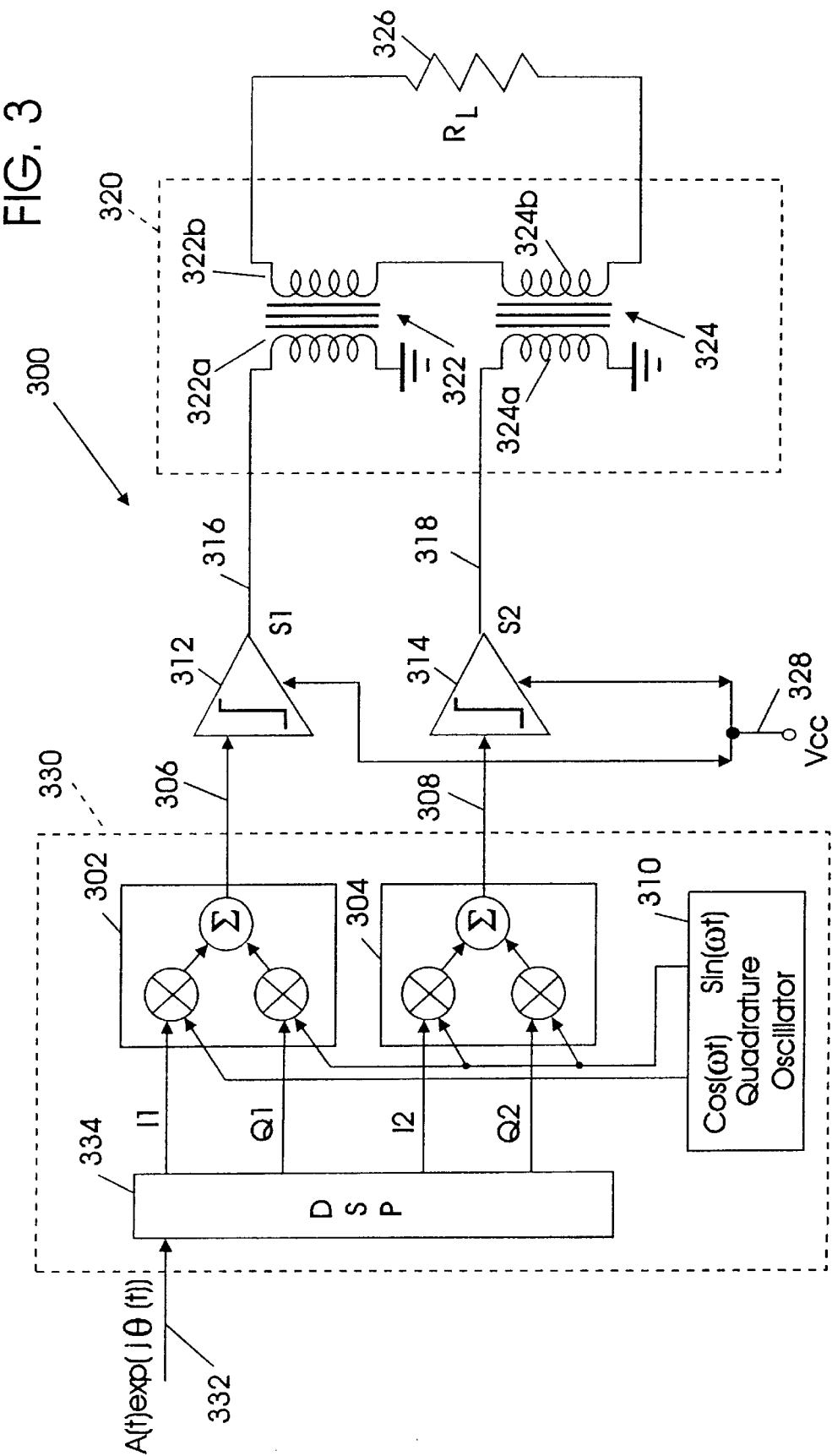
FIG. 3 is a block diagram of a first embodiment of power amplifiers according to the parent application.

Referring now to FIG. 3, a power amplifier 300 according to the parent application is described. Power amplifier 300 amplifies an AC input signal 332 of varying amplitude and varying phase to produce an amplified output signal voltage and an output current in a load impedance $R_l$ 326 using a DC power supply VCC 328. It will be understood that the load impedance 326 may be an antenna and the DC power supply 328 may be a battery.

Still referring to FIG. 3, the power amplifier 300 includes converting means 330 for converting the AC input signal 332 into a first signal 306 having constant amplitude and a first phase angle and into a second signal 308 having constant amplitude and a second phase angle. Converting means 330 may be formed by a digital signal processor (DSP) 334 that generates I1, Q1, I2 and Q2 signals. First and second quadrature modulators 302, 304 respectively, are responsive to a quadrature oscillator 310 and to the in-phase and quadrature signals I1, Q1, I2, Q2 to produce the first signal 306 and second signal 308. The design and operation of converting means 330, and the individual components thereof, are well known to those having skill in the art and need not be described further herein.

Still referring to FIG. 3, a first amplifier 312 amplifies the first signal 306, to produce a first output signal voltage S1 (316) of constant voltage amplitude. As will be described in detail below, the first amplifier 312 preferably includes bilateral amplifier devices that draw current from the DC power supply, but that also supply current to the DC power supply. Accordingly, the connection between first amplifier 312 and DC power supply 328 is shown to be bidirectional.

Still referring to FIG. 3, a second amplifier 314 amplifies the second signal 308 to produce a second output signal voltage of constant voltage amplitude S2 (318). As was described above, the second amplifier 314 also preferably includes bilateral amplifier devices that draw current from the DC power supply and supply current to the DC power supply. Amplifiers 312 and 314 may be class-C power amplifiers, although other classes of power amplifiers may also be used.

Still referring to FIG. 3, a coupler 320 couples the first and second amplifiers 312 and 314 to each other and to the load impedance 326 such that the voltage or current in the first amplifier become linearly related to the voltage or current in the second amplifier. Coupler 320 may be contrasted from a directional coupler that was used in a conventional Chireix circuit. In particular, the coupler 320 does not isolate the first and second amplifiers from one another. Rather, it interactively couples the first and second amplifiers to one another, so that each affects the other's load line.

In FIG. 3, the coupler 320 comprises a first transformer 322 and a second transformer 324. Their respective secondaries 322b and 324b are series-coupled across a load impedance 326. Their respective primaries 322a and 324a are coupled to the outputs 316 and 318 of first and second amplifiers 312 and 314 respectively. Accordingly, the sum of the first and second output signal voltages S1 and S2 produces the amplified output signal voltage across the load impedance 326 and also produces the output current through the load impedance. An amplifier current that is linearly related to the output current flows in the bilateral amplifier devices of both the first and second amplifiers 312 and 314.

The transformers 322 and 324 facilitate the series coupling of outputs that are relative to ground. The series coupling can ensure that the same current, equal to the load current or a scaled value thereof, flows in the output circuits of both amplifiers 312 and 314.

By omitting the output coupler of FIG. 2, which isolated the two amplifiers from each other, the amplifiers are now allowed to affect or interact with each other. In particular, when the two amplifiers are driven out of phase so that output signal S1 equals -S2, the sum of their outputs into load impedance RL will be zero and there will be no load current. Therefore, the current flowing in the amplifier devices will also be zero due to the series connection, which ensures that both amplifier currents and the load current are the same. If no current flows in the amplifier devices, the current consumed from the DC supply voltage Vcc will also be zero. Thus in contrast to the coupled power amplifiers of FIG. 2, which consume a constant amount of power from the supply even when the instantaneous load power is zero, the arrangement of FIG. 3 can reduce its current consumption as the instantaneous output power is reduced.

Figure 4:
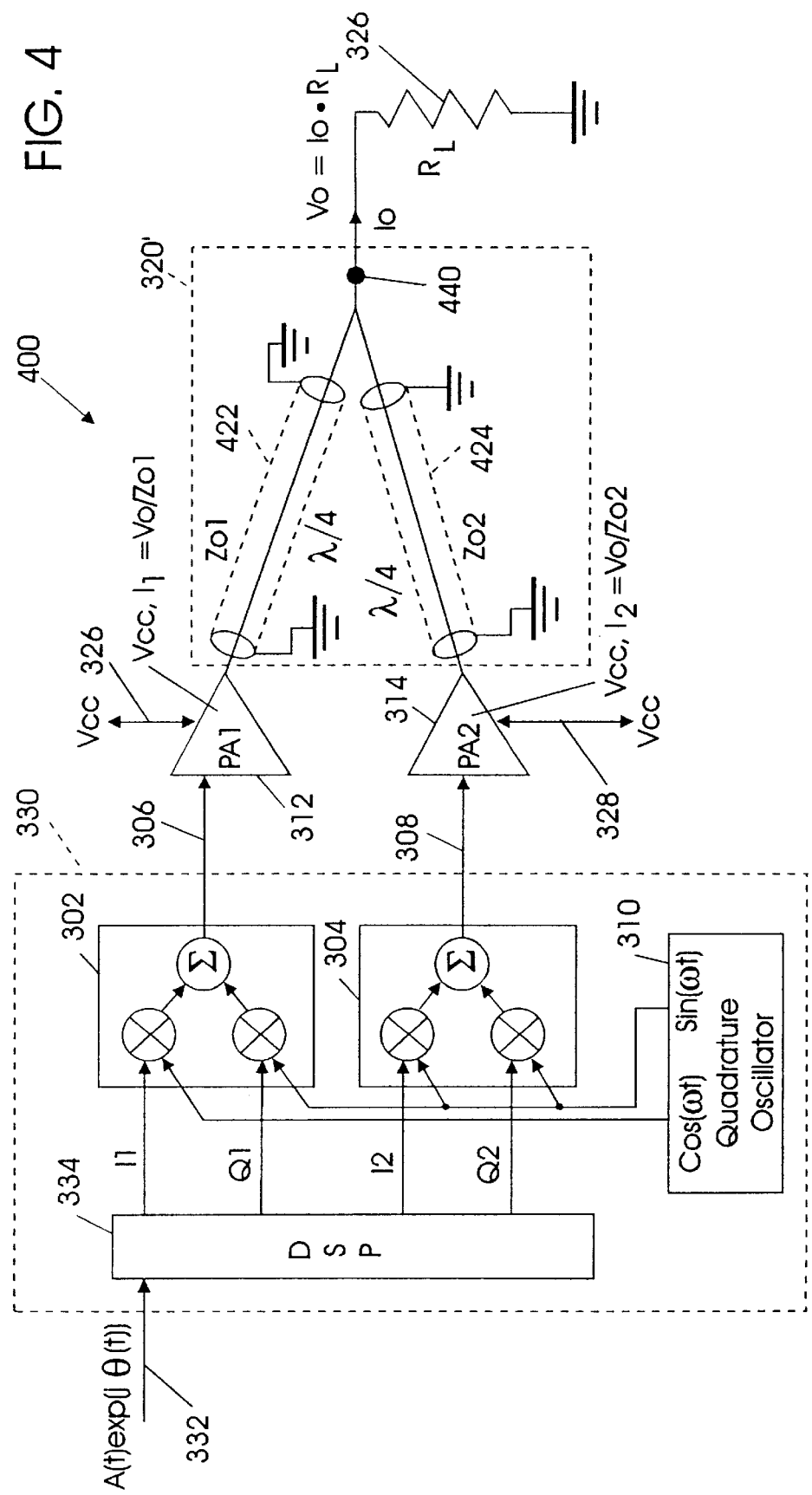
FIG. 4 is a block diagram of a second embodiment of power amplifiers according to the parent application.

Referring now to FIG. 4, a second embodiment of power amplifiers according to the parent application is shown. As shown in FIG. 4, power amplifier 400 is similar to power amplifier 300 of FIG. 3. However, the interactive coupler 320' that couples the first and second amplifiers 312 and 314 to the load impedance 326 is embodied by first and second quarter wavelength transmission lines 422 and 424 respectively. The load impedance includes an input node 440, and the first and second quarter wavelength transmission lines 422 and 424 are preferably coupled to the input node 440.

As illustrated in FIG. 4, series connection at microwave frequencies may be more practically achieved by parallel connection a quarter wave distant, using the two quarter wave lines 422 and 424. When the outputs of the two quarter wave lines are paralleled, the output voltages are forced to be the same (Vo) at the input node 440. This forces the currents to be the same quarter-wave away at the power amplifiers 312 and 314, if the lines are of equal impedance, creating the same conditions as in the series connection of FIG. 3. If the transmission lines are of different impedance 201, 202, the power amplifier output currents I1 and I2 are forced to be scaled in the inverse ratio of the impedances.

The power amplifiers ideally each generate an output swing of Vcc at their ends of their quarter wave lines. Since the voltages are the same at that end, the currents at the other end one quarter wave away must be equal with equal lines. With unequal line impedances, the currents will be respectively Vcc/Zo1 and Vcc/Zo2 at the junction of the lines. The total output current is thus Io =Vcc (1/Zo1+1/Zo2) or 2Vcc/Zo for equal lines.

If the power amplifiers generate relatively phased currents Vcc·EXP(jα) and Vcc·EXP(−jα), then the total output current is:

$$Io = VCC\left(\frac{\text{EXP}(j\alpha)}{Zo} + \frac{\text{EXP}(-j\alpha)}{Zo}\right)$$
$$= 2Vcc \cdot \cos(\alpha)/Zo,$$

assuming equal impedance Zo lines.

The voltage Vo is thus given by:

$$Io \cdot R_L = \frac{2VCC \cdot R_L \cos(\alpha)}{Zo}$$

This in turn forces the power amplifier currents to be:

$$\frac{2Vcc \cdot R_L \cos(\alpha)}{Zo^2}$$

showing that the peak current in each power amplifier has reduced by $\cos(\alpha)$, which it did not do in the case of hybrid coupling. When $\alpha=90$ degrees, the power amplifiers are antiphased, the output signals Vo, Io are zero, but so is the power amplifier current even though they are still driven to full Vcc output swing. It is as if the load impedance had been increased to infinity. Thus, by modulating $\alpha$ (in the DSP code), the effective load impedance seen by the power amplifiers is also modulated so that they generate only the instantaneously desired output power.

To obtain maximum efficiency, it is desirable to avoid harmonic currents flowing in the power amplifier output circuits. This may be obtained using a series resonant circuit in series with the power amplifier output terminal to present a low impedance to the fundamental and a high impedance to harmonics. However, a single shunt resonant circuit 550 may instead be connected one quarter wave away at the node of the two quarter wave lines, as shown in amplifier 500 of FIG. 5. The shunt resonator forces the voltage waveform to be sinusoidal at the junction of the lines (node 440), and therefore one quarter wave away the current at the power amplifier devices is forced to be sinusoidal.

Figure 6:
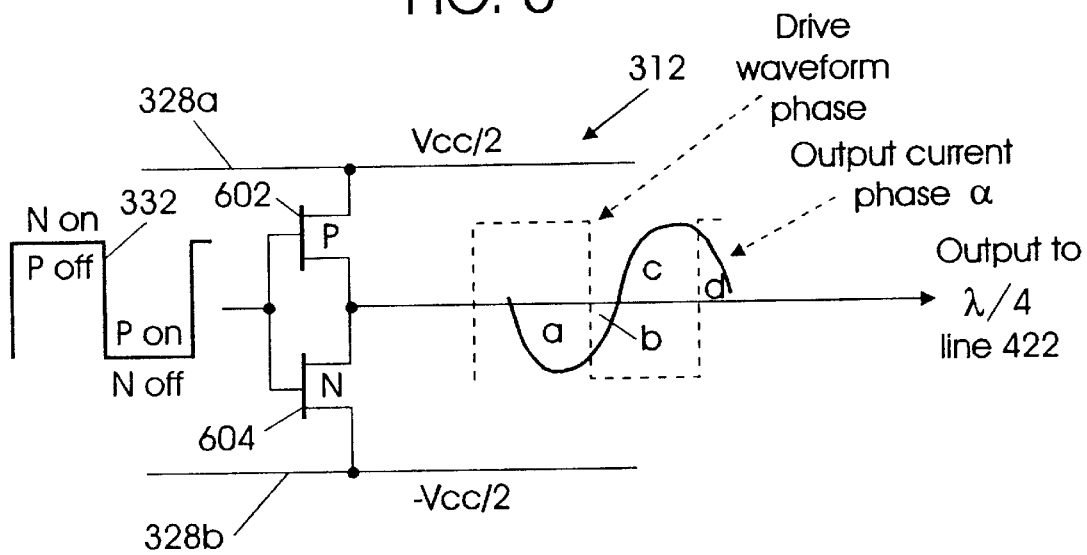
FIG. 6 is a circuit diagram of current and voltage relations in a power amplifier that uses bilateral devices.

As described above, the first and second amplifiers 312 and 314 respectively preferably include bilateral amplifier devices that draw current from the DC power supply 326 and supply current to the DC power supply. Accordingly, during part of the signal cycle of the AC input signal 332, current flows from the first and second amplifiers to the DC power supply to return energy to the DC power supply. FIG. 6 illustrates a power amplifier including bilateral amplifier devices according to the parent application.

As shown in FIG. 6, power amplifier 312 includes a P-type field effect transistor 602 and an N-type field effect transistor 604 that are respectively coupled between positive and negative power supplies 328a and 328b respectively. Input signal 332 is coupled to the P-type field effect transistor 602 and the N-type field effect transistor 604. These field effect transistors produce an output signal that is provided to the quarter wavelength line 422. Similar considerations apply to second amplifier 314.

When $\alpha$ is between 0 and 90 degrees, the sinusoidal current in the power amplifier devices is not in phase with the switching of the devices on and off, as illustrated in FIG. 6. As also shown in FIG. 6, the mean current from the power supplies is reduced by a further factor of $\cos(\alpha)$ relative to the peak current Ipk. Since Ipk also reduces with $\cos(\alpha)$, the net supply current reduces as $\cos^2(\alpha)$, which is the same factor by which the output power is reduced by modulating $\alpha$. The supply power and load power both therefore track, maintaining the same theoretical efficiency when backed off as when not. This relies on the use of bilateral power amplifier devices which can pass current in the reverse direction during part of the input signal cycle, returning energy to the battery.

That the theoretical efficiency using ideal bilateral devices is 100 % may be understood in the context of a single ended push-pull output stage, as shown in FIG. 6. In region "a" from 0 to $(\pi-\alpha)$, the current flows from $-Vcc/2$ to the load, while the N-type device is on, pulling down. This is delivering energy from $-Vcc/2$ source 328b to the load. In region "b", current is still negative, but the P-type device is on. That means current and energy are flowing back towards the $+Vcc/2$ source 328a. In region "c", current is flowing from the Vcc/2 328a source to the load while the P-type device is on, and in region "d", current is still positive when the N-type device comes on, sending current and energy back to the $-Vcc/2$ source b. The mean currents are thus:

$$\frac{Ipk}{2\pi}\left[\int_0^{\pi-\alpha} \sin(\theta)\delta\theta - \int_0^{\alpha} \sin(\theta)\delta\theta\right] = I_{pk}\cos(\alpha)/\pi$$

from each of the $-Vcc/2$ and $+Vcc/2$ supplies, that is reduced by the factor $\cos(\alpha)$ compared to an in-phase current.

In FIG. 6, the mean supply currents from the split supplies $-Vcc/2$ and $+Vcc/2$ are computed to be $Ipk/\pi$ when $\alpha=0$. The total power from both supplies is therefore:

$$\text{Ipk} \cdot \text{Vcc}/\pi. \qquad (1)$$

Figure 5:
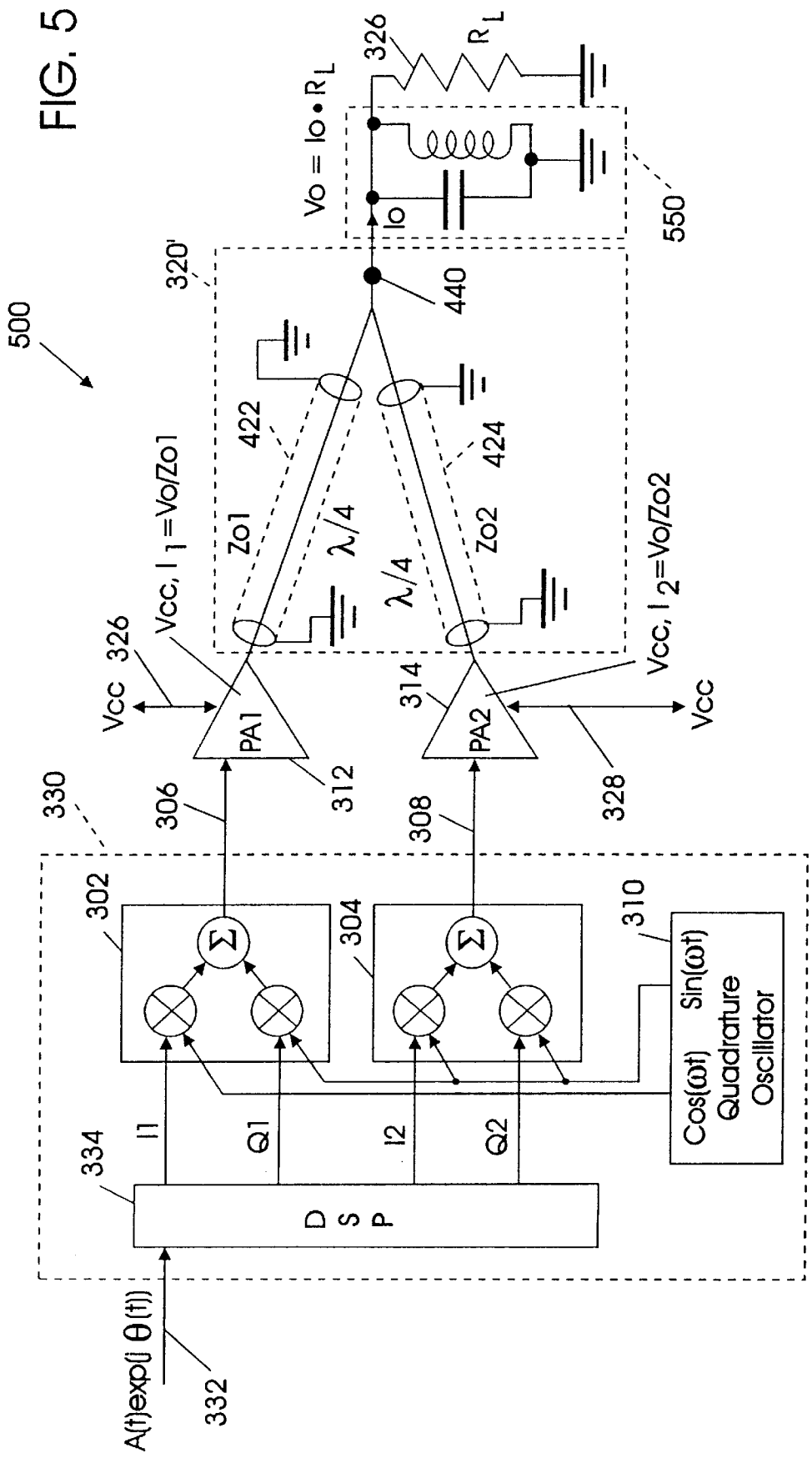
FIG. 5 is a block diagram of a third embodiment of power amplifiers according to the parent application.

The square-wave voltage swing at the single-ended power amplifier output is $-Vcc/2$ to $I-Vcc/2$ i.e. $Vcc/2$ peak, so the current at the end of a quarter wave line of impedance Zo must be a square wave of peak current $+/-Vcc/2Zo$. The fundamental component of a square wave is $4/\pi$ times the peak, so the fundamental current driving the resonator of FIG. 5 is:

$$\frac{2Vcc}{\pi \cdot Zo} \text{ peak} \qquad (2)$$

The current induces a peak load voltage of:

$$\frac{2Vcc \cdot R_L}{\pi \cdot Zo} \qquad (3)$$

The load power is thus ½×peak current × peak voltage:

$$= \frac{2Vcc^2 \cdot R_L}{(\pi \cdot Zo)^2} \qquad (4)$$

Equation (3) gives the sinusoidal voltage swing on the resonator at the end of the quarter wave line. Thus, the current at the power amplifier device end of the line is this divided by Zo, i.e.:

$$Ipk = \frac{2Vcc \cdot R_L}{\pi \cdot Zo^2} \qquad (5)$$

Substituting for Ipk from equation (5) into equation (1) gives the total DC input power as:

$$= \frac{2V_{cc}^2 \cdot R_L}{(\pi \cdot Z_o)^2} \quad (6)$$

which is the same as equation (4), showing that the efficiency is 100%

It is well known that a switch-mode inverter with lossless filtering to convert a square-wave to a sine-wave output gives theoretical 100% efficiency. However, in the arrangement of FIGS. 3 to 6, which is encapsulated in the transmitter of FIG. 7, the efficiency is maintained even for signals of varying amplitude, or when the transmitter is backed off to less than full output. In FIG. 7, amplifier 700 can use switch-mode (class-D) power amplifiers. The load 326 is an antenna. Thus, the present invention, which has no theoretical limitations to efficiency, is a better starting point than prior art power amplifiers, the theoretical efficiency of which is already less than 100% even with ideal devices.

Figure 8:
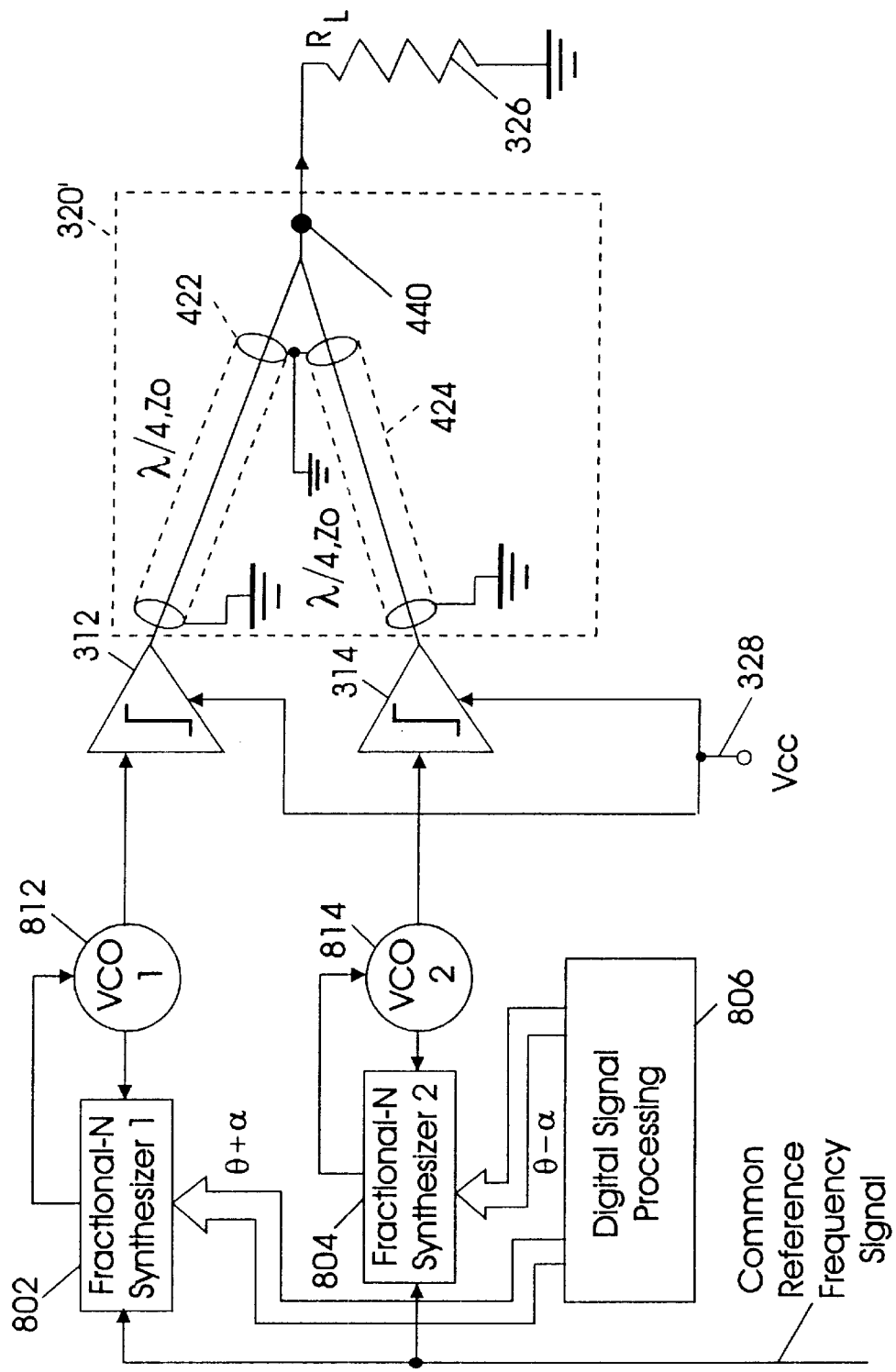
FIG. 8 is a block diagram of a fifth embodiment of power amplifiers according to the parent application.

The parent application uses means, such as a digital signal processor (DSP) 334, to convert a complex modulation signal having a varying amplitude and a varying phase into two modulation signals having constant amplitude and differently varying phases. It then uses means to produce two signals modulated by respective phase modulation signals. One means has been illustrated in FIG. 2, namely the use of two quadrature modulators 302, 304 driven respectively by the cosine and sine of their respective phase modulation signals. Another technique is shown in FIG. 8 wherein two frequency synthesizers, each modulatable in phase, such as modulatable fractional-N synthesizers 802 and 804 are used. A modulatable fractional-N synthesizer comprises an accumulator whose value determines the phase of an oscillator 812, 814 controlled by the synthesizer. Normally in a fractional-N synthesizer, the accumulator augments continuously (with wraparound) by the repeated addition of a slope value, which provides a frequency offset. To change the phase, the accumulator may be additionally augmented by adding once only a value equal to the change of phase desired. This arrangement is shown in FIG. 8.

Using two separate fractional-N synthesizers 802, 804, the cumulative nature of the delta-phase values added may get out of step. In practice therefore, the need to maintain synchronism suggests that the two synthesizers should be combined into a single chip. Moreover, the type of synthesizer called a "reciprocal fractional-N" disclosed by applicant in U.S. patent application No. 08/902,836, filed Jul. 30, 1997, assigned to the assignee of the present application, the disclosure of which is hereby incorporated herein by reference, may be advantageous, as it modulates the reference divider controlled by a fixed reference frequency, which is then easier to synchronize when two modulated synthesizers are required.

Another directly phase-modulatable synthesizer technique is the Direct Digital Synthesizer or DDS, in which an accumulator computes the value of ($\omega t + \phi$) continuously and converts the most significant part to a sine wave using a sine look-up table. Any other conventional method of producing phase modulated signals can also be used with the parent application.

When the invention of the parent application is to be used to generate signals that vary both in amplitude and phase, the two constant envelope amplifiers generate signals that vary in phase by the sum and difference respectively of the desired phase variation and an amplitude determining phase component. When the variation of both phase components is in the same direction, the sum phase varies faster; otherwise the difference phase varies faster. One phase thus varies faster than the other and the rate of phase variation can become very large when the desired signal vector has a trajectory that passes close to the origin (0.0) of the complex plane. If the signal vector passes exactly through the origin, i.e. the signal amplitude goes to zero, both phase variations have finite derivatives. However, for a vector that passes infinitesimally close to the origin, the phase derivatives can be arbitrarily large.

It is a potential advantage that constant amplitude signals varying only in phase can be produced using modulated phase locked loops. However, the rate of change of phase produced by a phase locked loop generally is limited by its loop bandwidth. It is desired to avoid using excessively wide loop bandwidths so that the phase locked loop helps to filter out unwanted noise and prevent wideband noise from being transmitted. However, the use of narrow phase locked loops may limit the ability to accurately reproduce complex signal vector trajectories that pass close to the origin. The present invention can resolve this design conflict and can permit the use of more desirable phase locked loop parameters without impacting the accuracy with which complex signal trajectories can be reproduced.

Figure 9:
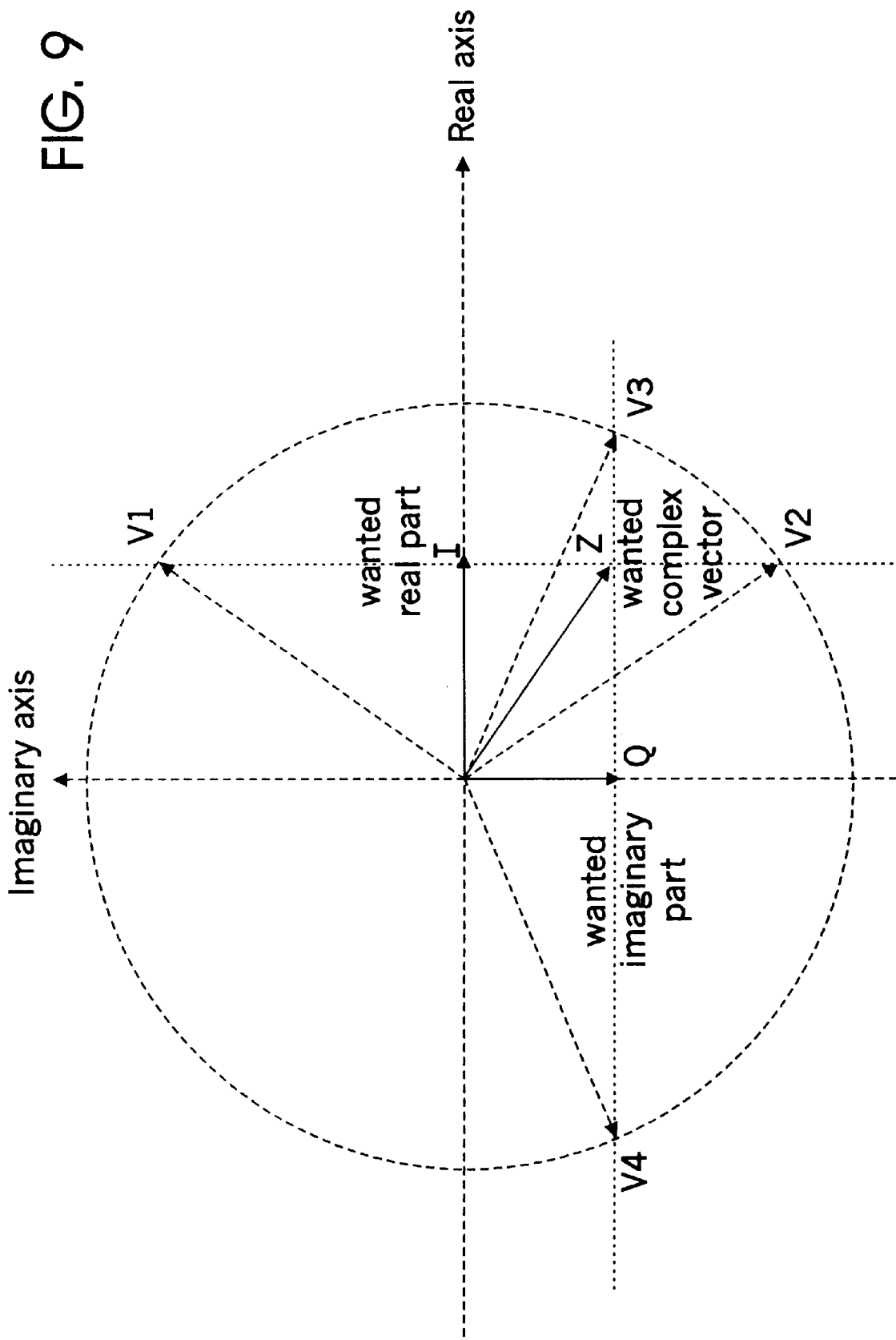
FIG. 9 graphically illustrates synthesis of a complex vector using four constant magnitude vectors according to the present invention.

A first aspect is described with the aid of FIG. 9. FIG. 9 shows synthesis of a complex vector Z by separately synthesizing its real part I and its imaginary part Q. These are each in turn synthesized by adding pairs of constant-amplitude, counter-rotating, variable-phase vectors. Thus, FIG. 9 shows addition of four constant amplitude vectors, V1, V2 (which combine to yield the real part I) and V3, V4 (which combine to yield the imaginary part Q).

An advantage of using a pair of vectors to synthesize only the real or the imaginary part is that the trajectory of the real or imaginary part alone must pass through the origin exactly upon changing sign. The rate at which the value passes through zero is limited by the finite bandwidth of the complex signal being synthesized. Thus, the rate of rotation of each of the four vectors V1, V2, V3 and V4 may be guaranteed to be finite when synthesizing a finite bandwidth signal. Moreover, each of the vectors only ever has to rotate through +/−90 degrees relative to a mean phase, in order to produce a real or imaginary part varying between plus the maximum and minus the maximum signal amplitude. Thus the design of phase locked loops may be eased compared to the use of only two constant amplitude vectors, where the phase of each vector can need to rotate through the full 360 degrees and continue rotating through any multiple of 360 degrees.

Figure 10:
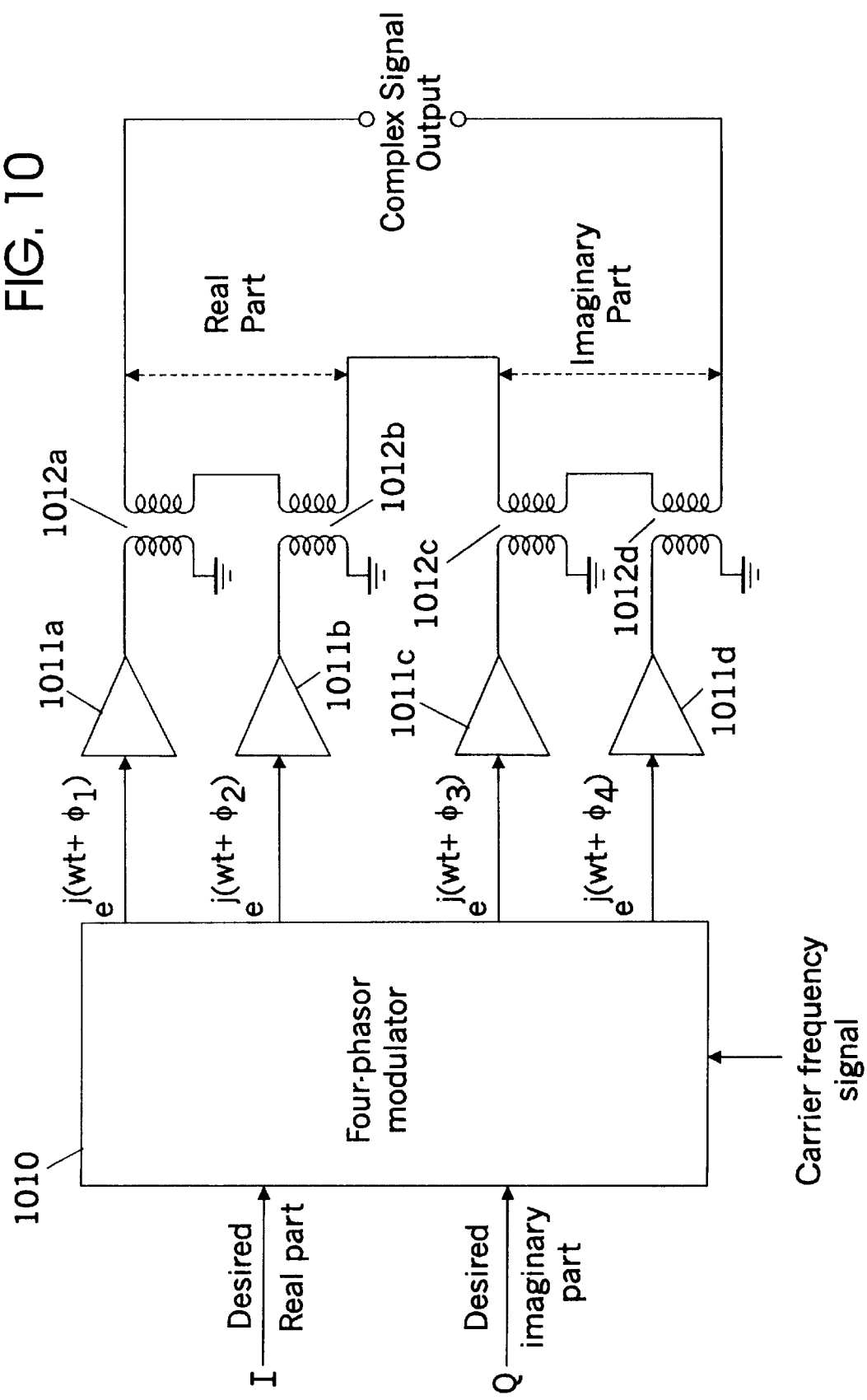
FIG. 10 is a block diagram of systems and methods for defining an input signal of varying amplitude and varying phase to a desired power level using more than two signals of constant amplitude and controlled phase according to the present invention.

FIG. 10 shows an arrangement of four, coupled, constant-amplitude power amplifiers 101a, 1011b, 1011c, and 1011d according to the invention. A four-phasor modulator 1010 is fed with information on the desired signal to be transmitted, which can for example be described by the waveform of the real part I (cosine carrier component) of the complex signal and the waveform Q of the imaginary part (sine carrier component). Modulator 1010 produces four, constant amplitude, varying phase signals denoted by:

$$e^{(j\omega t + \phi 1)}$$

$$e^{(j\omega t + \phi 2)}$$

$$e^{(j\omega t + \phi 3)}$$

and $$e^{(j\omega t + \phi 4)}$$

where $\phi 1$=ARC COS(I); $\phi 2$=$-\phi 1$; $\phi 3$=90−ARC COS(Q) and $\phi 4$=180−$\phi 3$, and "w" is the frequency of the carrier frequency signal which may be supplied at another input.

Because the ARC COS function is undefined for arguments greater than unity, the desired signal Z=I+jQ is properly scaled so that its peak amplitude never exceeds unity, and is preferably just less than unity. Scaling to a desired power level is accomplished by amplifiers 1011a. . . 1011d. The outputs of amplifiers 1011a,1011b, corresponding to vectors V1,V2 of FIG. 9, are added in series using transformers 1012a and 1012b to produce the real part I. The real part I will consist of a cosine carrier component only that is modulated in amplitude from positive amplitudes to negative amplitudes, i.e. Double-SideBand, Suppressed Carrier modulation (DSBSC). Likewise, the outputs of amplifiers 1011c, 1011d corresponding to vectors V3, V4 of FIG. 9 are added in series using transformers 1012c, 1012d to produce the imaginary part Q, which is a DSBSC modulated sine carrier component. The outputs of all transformers are then coupled in series to add I and Q to obtain the desired complex signal modulation Z=I+jQ.

As disclosed in the parent application, series coupling causes the same output or load current to flow in all amplifier devices, irrespective of their voltage contribution to the total output signal. When that current is in phase with an amplifier's voltage contribution, that amplifier is delivering power from the DC source to the load. When the amplifier's voltage contribution is in antiphase with the load current, that amplifier acts as a synchronous rectifier and returns current to the DC source, providing bilateral output devices are used. When an amplifier's voltage contribution is 90 degrees out of phase with the load current, current is consumed from the DC source during part of the AC signal cycle and returned to the DC source during the other part of the cycle, consuming no net current from the source in the mean. Thus the only mean power consumed by amplifiers 1011a. . . 1011d from their common DC source (not shown) corresponds to power delivered to the output circuit or load, which therefore corresponds only to the desired signal waveform Z. The theoretical efficiency of the amplifier with ideal bilateral amplifier devices is therefore 100%, in contrast to prior art linear amplifiers that have lower theoretical efficiencies even with ideal devices.

Figure 13:
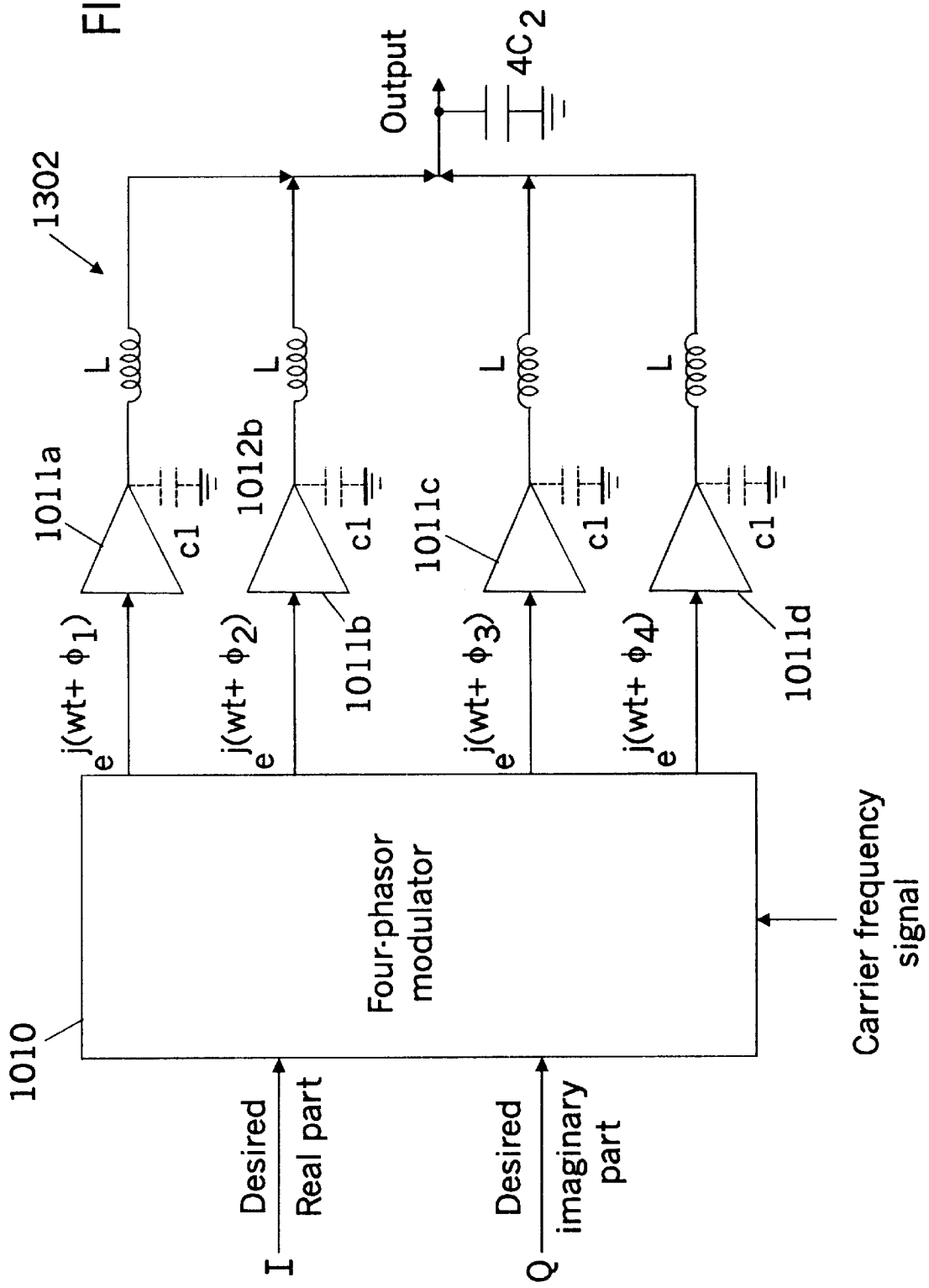
FIG. 13 is a block diagram of another embodiment of systems and methods for defining an input signal of varying amplitude and varying phase to a desired power level using more than two signals of constant amplitude and controlled phase according to the present invention.

For very high frequency and microwave operation, it was disclosed in the parent application that a more practical form of series coupling can be to use parallel coupling one quarter wavelength away from the amplifiers, using quarter wave transmission lines of appropriate impedance. The choice of impedance is made to match the amplifiers to the load impedance, e.g. an antenna, for generating the desired total output power. The length of the quarter-wave coupling lines should also be shortened as necessary to compensate for the output capacitance of the amplifier devices. Quarter-wave line equivalent circuits may also be constructed with discrete inductors and capacitors, for example in a Pi-network configuration 1302, as shown in FIG. 13. The first capacitor C1 of each Pi network C1, L, C2 can absorb the output capacitance of the amplifier devices while the second capacitors C2 can be combined into a single capacitance 4C2. Such networks preferably should be designed to reflect a high impedance at the amplifiers at as many odd harmonics as possible, using additional LC components, and the amplifiers should preferably be push-pull amplifiers that suppress even harmonics of the carrier frequency.

Figure 11:
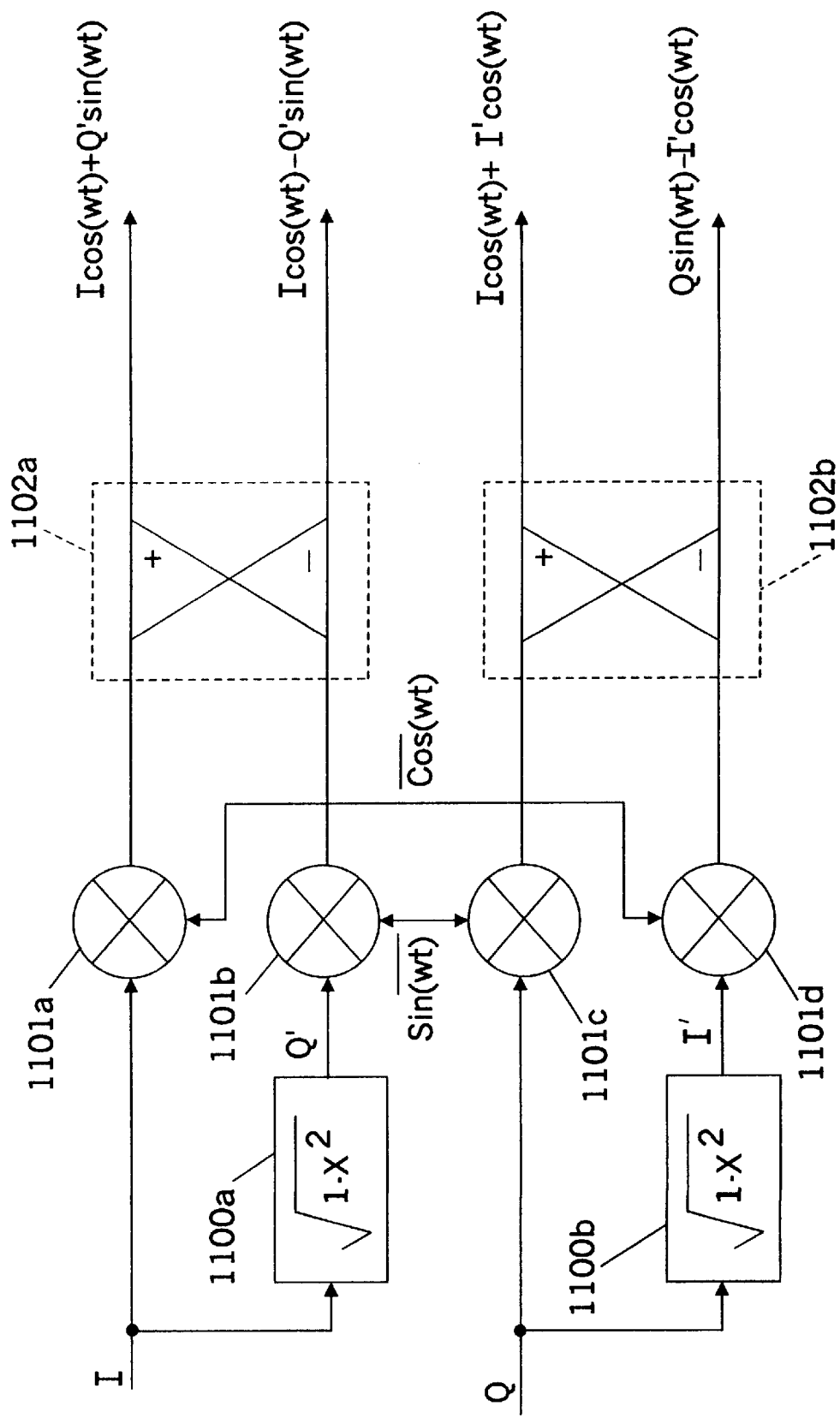
FIG. 11 is a block diagram of a four-phasor modulator of FIG. 10.

FIG. 11 shows more detail of one implementation of a four-phasor modulator 1010 of FIG. 10. The I signal is fed to a first balanced modulator 11011a where it multiplies a cosine carrier component to produce Icos(wt). The I signal is also fed to function generator 1100a that derives a signal Q' from I such that the sum of the squares of I and Q' is a constant. This is achieved if the function f(x) implemented by the function generator 1100a is a $\sqrt{1-x^2}$ function. Q' is fed to a second balanced modulator 1101b where it multiplies a sine carrier component to obtain Q'sin(wt). Butterfly circuit 1102a forms both the sum and the difference of the outputs of modulators 1101a,1101b to obtain:

Icos(wt)+Q'sin(wt)

and

Icos(wt)−Q'sin(wt), both of which have the constant amplitude $\sqrt{I^2+Q^2}$.

These two constant-amplitude drive signals correspond to vectors V1 and V2 of FIG. 9 and drive amplifiers 1011a and 1011b of FIG. 10.

The desired Q signal component feeds a similar circuit except that Q multiplies the sine carrier component in balanced modulator 1101c and the derived signal I', derived using function generator 1100b, multiplies the cosine carrier in balanced modulator 1101d. Butterfly circuit 1102b then forms the sum and difference of the outputs of modulators 1101c and 1101d to obtain the two constant amplitude signals Qsin(wt)+I'cos(wt) and Qsin(wt)−I'cos(wt), which correspond to vectors V3 and V4 of FIG. 9, and drive amplifiers 1011c and 1011d of FIG. 10.

It is common to encode information for transmission and to convert coded information to baseband modulating signals I and Q using digital signal processing. I and Q may first be produced using digital signal processing as a sequence of numerical samples, which are then converted to analog waveforms by means of digital to analog (DtoA) convertors. A technique for eliminating the DtoA convertors is described in U.S. Pat. No. 5,530,722 to the present inventor, the disclosure of which is hereby incorporated by reference herein. The technique involves converting the numerical I/Q sample streams to high bitrate, sigma-delta modulation, which can then be converted to analog signals by low-pass filtering.

The balanced modulators 1101a, 1101b, 1101c and 1101d can, for example, be of the type known as Gilbert Cells, which are easy to fabricate in semiconductor processes. The output signal from a Gilbert Cell is a balanced (i.e. push-pull) current and the output of two Gilbert cells can therefore be added by paralleling their outputs to add their output currents. Reversal of the connections of one Gilbert cell then causes subtraction. Thus the Butterfly circuits 1102a, 1102b may be obtained by parallel coupling the outputs of Gilbert cells, using a reversal of connections to one Gilbert cell for the difference output. The current outputs from a Gilbert cell may be duplicated using current mirrors in order to obtain one balanced output for forming the sum and a similar balanced output for forming the difference. It is also known from the incorporated references that, for modulating data signals, the entire sigma-delta bitstream may be precomputed and stored in a look-up table for different, finite-length data symbol sequences and recalled by addressing the table with modulating data sequences to obtain the correct sigma-delta waveforms.

One of the potential benefits of synthesizing a signal for transmission using only phase-modulated signals is that the phase modulation may be applied to an oscillator running directly at the output frequency and with a power output that is higher than that achievable from prior art quadrature modulators. Thus the power amplifier may need less gain to amplify the oscillator output and thus amplifies wideband noise less. Preventing the power amplifier from amplifying wideband noise can help avoid interference from the transmitter to a receiver in the same or in a nearby apparatus, such as a cellular telephone. The technique of first generating a phase modulated signal at a transmit intermediate frequency and then transferring that phase modulation by means of a phase locked loop to a transmit frequency VCO is further described in U.S. Pat. No. 5,535,432 to the present inventor, the disclosure of which is hereby incorporated by reference and has been used in cellular phones conforming to the GSM digital cellular standard manufactured by L. M. Ericsson and sold in Europe since 1992. An application of this scheme with the present invention is shown in FIG. 12.

Figure 12:
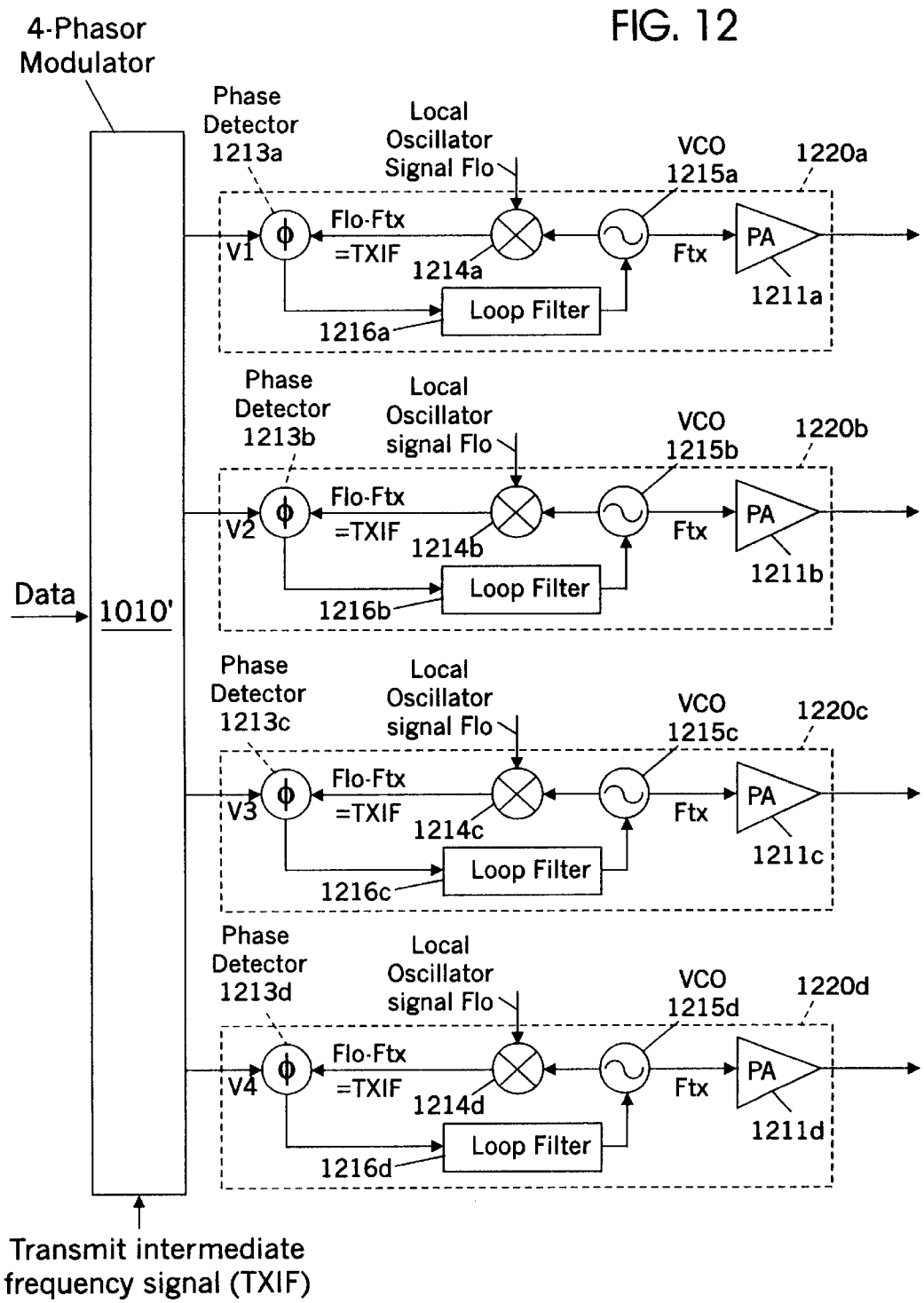
FIG. 12 is a block diagram of systems and methods for filtering a phase modulated signal using phase locked loops according to the present invention.

Referring now to FIG. 12, the four-phasor modulator 1010' produces phase modulated signals at a transmit intermediate frequency (TXIF). A transmit frequency voltage controlled oscillator 1215a produces a signal at transmit frequency Ftx which is amplified by power amplifier 1211a. A portion of the output of oscillator 1215a is fed to down-converting mixer 1214a where it is heterodyned with a local oscillator signal of frequency Flo, which is offset from the desired transmit frequency Ftx by the TXIF, i.e.

$$Flo=Ftx+/-TXIF.$$

In a cellular telephone, the local oscillator signal often is the same as already used in the receiving section, which is ensured by choosing TXIF correctly so that the transmit frequency is displaced from the receive frequency by an amount known as the "duplex spacing".

The difference frequency output from heterodyne down-convertor (mixer 1214a) at a frequency TXIF is phase compared in phase detector 1213a with the phase-modulated TXIF signal from modulator 1010'. If the compared phases do not match, a phase error signal is generated by phase detector 1213a which is integrated in loop filter 1216a to produce a correcting control signal to VCO 1215a, thus controlling the phase and frequency of VCO 1215a to follow the phase modulation from modulator 1010'.

The entire Phase Locked Loop phase-transfer circuit 1220a comprising elements 1213a, 1214a, 1215a and 1216a and power amplifier 1211a is replicated as 1220b, 1220c and 1220d for the other three phasor channels. Four-phasor modulator 1010' is shown in FIG. 12 having a single data input rather than I and Q inputs. Thus, 4-phasor modulator 1010' is assumed to incorporate the conversion of data symbol sequences to I,Q waveforms, using, for example, precomputed look-up tables as discussed above When the transmit output frequency is to be changed between different channels, it now suffices to change the local oscillator frequency Flo, and the generated transmit signal will change to the new channel in step with the change to Flo. A benefit of using phase locked loops to transfer the phase modulation to the output frequency is that the phase locked loop bandwidth determined by loop filters 16a...16d need only have a bandwidth sufficient to pass the modulation accurately, and thus can help to reject wideband noise which could otherwise be amplified by power amplifiers 1211a... 1211d, potentially interfering with a receiver.

Another aspect of the invention will now be described that corresponds to the more general inventive principle of synthesizing a vector of variable phase and amplitude by combining more than two vectors of constant amplitude. One special case of combining four vectors was discussed in detail above with the aid of FIGS. 9 to 13. In that example, the vectors were combined in pairs to produce the real and the imaginary parts of the desired complex signal vector. An objective was to eliminate the likelihood of large rate-of-change of phases being needed on any vector. The excess degrees of freedom available in using more than two constant amplitude vectors to synthesize a complex vector may be more generally targeted to reduce the maximum rate-of-change of phase needed for any vector. The minimum rate-of-change of phase solution would not necessarily turn out to combine two vectors to generate the real part and two vectors to generate the imaginary part, and this would not be the solution if three or five vectors were used.

The general problem may be formulated mathematically as follows:

Find N phase waveforms $\phi(1) \ldots \phi(N)$ such that $$\sum_{k=1}^{N} e^{j\phi(k)} = Z(t),$$

a desired complex waveform
   and the largest $|\dot{\phi}(k)|$ is minimized.

An alternative goal is to minimize the sum of the squares of the phase derivatives, i.e.:

Find N phase waveforms $\phi(1) \ldots \phi(N)$ such that $$\sum_{k=1}^{N} e^{j\phi(k)} = Z(t),$$

a desired complex waveform
   and $$\sum_{k=1}^{N} |\dot{\phi}(k)|^2$$

is minimized.

The above can be restated as a standard Lagrange multiplier problem as:

Minimize $$\sum_{k=1}^{N} |\dot{\phi}(k)|^2$$

subject to $$\sum_{k=1}^{N} je^{j\phi(k)}\dot{\phi}(k) = \dot{Z}(t)$$

Splitting the above complex equation involving Z into its real and imaginary constituent waveforms I and Q, and defining the 2×N matrix A as:

$$[A] = \begin{bmatrix} \cos(\phi 1)\cos(\phi 2) \ldots \cos(\phi_N) \\ \sin(\phi 1)\sin(\phi 2) \ldots \sin(\phi_N) \end{bmatrix}$$

the Lagrange multiplier problem has the solution:

$$\begin{pmatrix} \dot{\phi}1 \\ \dot{\phi}2 \\ \vdots \\ \dot{\phi}_N \end{pmatrix} = A^{\#}[A.A^{\#}]^{-1} \begin{pmatrix} \dot{Q}(t) \\ -\dot{I}(t) \end{pmatrix}$$

The above equation is a set of N, non-linear differential equations which can in principle be solved for the N phase waveforms, given the desired complex signal waveform Z(t), in terms of its real part I(t) and its imaginary part Q(t). Such a solution may be onerous to perform in real time, but as digital processors become ever more powerful and the real-time solution method may soon, if not already, be an economically practical implementation. The problem can be stated in discrete time steps of dt to obtain phase waveform samples in steps of dt, given the values of Z(t) at discrete steps dt as Z1=I1+jQ1; Z2=I2+jQ2 . . . etc.

The values of the phases at time step number "i" can then be derived from the above differential equation to be:

$$\begin{pmatrix} \phi 1 \\ \phi 2 \\ \vdots \\ \phi_N \end{pmatrix}_i = A^\# [A.A^\#]^{-1} \begin{pmatrix} Q(i) - \overline{Q}(i-1) \\ \overline{I}(i-1) - I(i) \end{pmatrix} + \begin{pmatrix} \phi 1 \\ \phi 2 \\ \vdots \\ \phi_N \end{pmatrix}_{i-1}$$

where $\overline{I}$, $\overline{Q}$ are the previously achieved values given by $$\overline{I}(I-1) + j\overline{Q}(I-1) = \sum_{k=1}^{N} e^{j\phi k(i-1)}.$$

The use of the previously achieved I,Q values at timestep (i−1) as the stepping-off point from which to reach the new desired I,Q values at timestep "i" can ensure that computational errors such as rounding errors in the previously achieved values are compensated by computing the step change in the phase values necessary to move from the previously achieved values, including error, to the new desired values. Thus, computational errors may be prevented from accumulating.

In the above, the matrix A is computed again from the new phase values after every step. Also after every step, the new phase values are applied to a phase modulator, which can include any or all of digital to analog conversion of the phase values, filtering of the converted phase values, phase locked loops for transferring phase modulation to a desired transmitter output frequency, phase modulatable frequency synthesizers such as fractional-N synthesizers or Direct Digital Synthesizers (DDS), or alternatively reconversion of phase values to I,Q values using a Cosine/Sine function or table followed by the use of quadrature modulators to modulate each pair of I and Q values on to a desired radio frequency carrier signal to obtain N constant amplitude signals whose sum will be the desired phase and amplitude modulated signal.

When the desired modulation arises from a digital information signal, the computation can often be simplified, by utilizing the fact that the complex modulation waveform Z(t) is at each time a function of only a limited number L of past and future digital information symbols. Thus there are at each time only a limited number $M^L$ of possible values of Z(t) that can arise, where M is the size of the alphabet of possible information symbols. All possible waveforms of Z(t) can thus be precomputed for all possible sequences of M symbols. Likewise, using the above equations, all possible sets of N phase waveforms can be precomputed and associated with symbol sequences in a waveform look-up table. Actual information symbol sequences are then applied to address the table to extract the precomputed phase waveforms or equivalent I,Q waveforms, thus saving on real-time computation required. One advantage of precomputation is to detect and then avoid any tendency of the matrix A.A# to become singular by taking an alternative route between successive points that may temporarily depart from the minimum rate-of-change of phase solution in order to avoid the need for a greater rate of chance of phase later.

Accordingly an amplitude and phase-varying signal may be generated efficiently at a power level for transmission, based on series combining (or the equivalent) more than two amplified signals of constant power level. General methods and systems for computing the required phase variations of each of the constant amplitude signals have been presented which may be used for three or more signals. Specific methods and systems for generating and combining four signals have also been presented, which may be simpler and may be a preferred solution. All variations based on the above teachings which may be made by a person skilled in the art are considered to fall within the spirit and scope of the invention as described by the following claims.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for generating from a signal of varying amplitude and varying phase, a plurality of constant amplitude varying phase signals, the sum of which is the signal of varying amplitude and varying phase, comprising the steps of:

generating a cosine carrier modulation waveform I(t) and a sine carrier modulation waveform Q(t) from the signal of varying amplitude and varying phase;

generating a complementary waveform Q'(t) from the cosine carrier modulation waveform I(t) such that the sum of the squares of I(t) and Q'(t) is constant;

modulating a cosine carrier signal with I(t) to obtain a first modulated cosine carrier;

modulating a sine carrier signal with Q'(t) to obtain a first modulated sine carrier; and forming a sum and difference of the first modulated cosine carrier and the first modulated sine carrier to obtain the constant amplitude varying phase signals.

2. A method according to claim 1 further comprising the steps of:

generating a complementary waveform I'(t) from the sine carrier modulation waveform Q(t) such that the sum of the squares of I'(t) and Q(t) is constant;

modulating a cosine carrier signal with I'(t) to obtain a second modulated cosine carrier;

modulating a sine carrier signal with Q(t) to obtain a second modulated sine carrier; and forming a sum and difference of the second modulated cosine carrier and the second modulated sine carrier to obtain a second set of constant amplitude varying phase signals.

3. A system for generating from a signal of varying amplitude and varying phase, a plurality of constant amplitude varying phase signals, the sum of which is the signal of varying amplitude and varying phase, the system comprising:

means for generating a cosine carrier modulation waveform I(t) and a sine carrier modulation waveform Q(t) from the signal of varying amplitude and varying phase;

means for generating a complementary waveform Q'(t) from the cosine carrier modulation waveform I(t) such that the sum of the squares of I(t) and Q'(t) is constant;

means for modulating a cosine carrier signal with I(t) to obtain a first modulated cosine carrier;

means for modulating a sine carrier signal with Q'(t) to obtain a first modulated sine carrier; and means for forming a sum and difference of the first modulated cosine carrier and the first modulated sine carrier to obtain the constant amplitude varying phase signals.

4. A system according to claim 3 further comprising:

means for generating a complementary waveform I'(t) from the sine carrier modulation waveform Q(t) such that the sum of the squares of I'(t) and Q(t) is constant;

means for modulating a cosine carrier signal with I'(t) to obtain a second modulated cosine carrier;

means for modulating a sine carrier signal with Q(t) to obtain a second modulated sine carrier; and means for forming a sum and difference of the second modulated cosine carrier and the second modulated sine carrier to obtain a second set of constant amplitude varying phase signals.

5. A system for generating from a signal of varying amplitude and varying phase, a plurality of constant amplitude varying phase signals, the sum of which is the signal of varying amplitude and varying phase, the system comprising:

an IQ waveform generator that generates a cosine carrier modulation waveform I(t) and a sine carrier modulation waveform Q(t) from the signal of varying amplitude and varying phase;

a function generator that generates a complementary waveform Q'(t) from the cosine carrier modulation waveform I(t) such that the sum of the squares of I(t) and Q'(t) is constant;

a first modulator that modulates a cosine carrier signal with I(t) to obtain a first modulated cosine carrier;

a second modulator that modulates a sine carrier signal with Q'(t) to obtain a first modulated sine carrier; and a circuit that forms a sum and difference of the first modulated cosine carrier and the first modulated sine carrier to obtain the constant amplitude varying phase signals.

6. A system according to claim 5 further comprising:

a second function generator that generates a complementary waveform I'(t) from the sine carrier modulation waveform Q(t) such that the sum of the squares of I'(t) and Q(t) is constant;

a third modulator that modulates a cosine carrier signal with I'(t) to obtain a second modulated cosine carrier;

a fourth modulator that modulates a sine carrier signal with Q(t) to obtain a second modulated sine carrier; and a second circuit that forms a sum and difference of the second modulated cosine carrier and the second modulated sine carrier to obtain a second set of constant amplitude varying phase signals.

7. A method for generating a radio frequency signal at a desired transmit power level, the radio frequency signal being modulated in phase and amplitude with an information source signal, the method comprising:

generating from the information source signal a complex baseband signal representative of the phase and amplitude modulation, the complex baseband signal comprising an in-phase signal and a quadrature signal;

using the in-phase and quadrature signals to modulate a radio carrier frequency to produce more than two modulated radio frequency signals of constant amplitude and varying phase;

separately amplifying each of the more than two modulated radio frequency signals; and combining the more than two amplified modulated radio frequency signals to produce the desired radio frequency signal that is modulated in phase and amplitude with the information source signal at the desired transmit power level.

8. A method according to claim 7 wherein the more than two modulated radio frequency signals of constant amplitude and varying phase are four signals, a first pair of the four signals being modulated in phase only in dependence on the in-phase signal and the second pair of the four signals being modulated in phase only in dependence on the quadrature signal.

9. A method according to claim 8 wherein a sub-combination of the first pair of signals is a radio frequency signal modulated in amplitude according to the in-phase signal and a sub-combination of the second pair of signals is a radio frequency signal modulated in amplitude according to the quadrature signal, and the sub-combinations are in quadrature and combine to produce the radio frequency signal that is modulated in phase and amplitude with the information signal at the transmit power level.

10. A method according to claim 9 wherein the phases of the first pair of signals are modulated in a counter-rotating manner in dependence only on the in-phase signal and the phases of the second pair of signals are modulated in a counter-rotating manner in dependence only on the quadrature signal.

11. A method according to claim 7 wherein the separately amplifying comprises separately amplifying each of the more than two signals of constant amplitude and controlled phase in separate saturated amplifiers.

12. A method according to claim 7 wherein the combining comprises series connecting the separately amplified signals with a load impedance such that the load impedance receives the sum of the voltages of the separately amplified signals.

13. A method according to claim 7 in which the combining comprises connecting each of the separately amplified signals via a quarter wavelength transmission line or discrete component equivalent thereof to a single terminal of a load impedance such that the load impedance receives a signal current proportional to a sum of the separately amplified signals.

14. A method according to claim 13 in which the discrete equivalent to the quarter wavelength lines comprises an inductance that connects each of the separately amplified signals to the load terminal.

15. A method according to claim 13 wherein the more than two quarter wavelength transmission line equivalent networks are more than two Pi-networks comprising inductors and capacitors.

16. A method according to claim 15 wherein the capacitors include output capacitors that are combined in parallel.

17. A method according to claim 15 wherein the capacitors include input capacitors that include the output capacitance of the associated separate amplifiers.

18. A method according to claim 7 wherein the modulating comprises phase modulating each of the more than two signals of constant amplitude in dependence on the in-phase and quadrature signals.

19. A method according to claim 7 wherein the modulating comprises quadrature modulating each of the more than two signals of constant amplitude in dependence on the in-phase and quadrature signals.

20. A method according to claim 7 wherein the modulating comprises using a separate phase locked loop to filter each of the more than two signals.

21. A method according to claim 8 further comprising:
generating a signal Q' complementary to the in-phase signal such that the sum of the squares of the in-phase signal and Q' is constant;
modulating a cosine signal at the radio carrier frequency with the in-phase signal and a sine signal with the Q' signal to produce a modulated cosine and a modulated sine signal;
forming the first pair of signals as the sum and the difference of the modulated cosine and modulated sine signal;
generating a signal I' complementary to the quadrature signal such that the sum of the squares of I' and the quadrature signal is constant;
modulating a cosine signal at the radio carrier frequency with the I' signal and a sine signal with the quadrature signal, to produce a modulated cosine and a modulated sine signal; and
forming the second pair of signals as the sum and the difference of the modulated cosine and modulated sine signals.

22. A system for generating a radio frequency signal at a desired transmit power level, the radio frequency signal being modulated in phase and amplitude with an information source signal, the system comprising:
means for generating from the information source signal a complex baseband signal representative of the phase and amplitude modulation, the complex baseband signal comprising an in-phase signal and a quadrature signal;
means for modulating a radio carrier frequency using the in-phase and quadrature signals to produce more than two modulated radio frequency signals of constant amplitude and varying phase;
means for separately amplifying each of the more than two modulated radio frequency signals; and
means for combining the more than two amplified modulated radio frequency signals to produce the desired radio frequency signal that is modulated in phase and amplitude with the information source signal at the desired transmit power level.

23. A system according to claim 22 wherein the more than two modulated radio frequency signals of constant amplitude and varying phase are four signals, a first pair of the four signals being modulated in phase only in dependence on the in-phase signal and the second pair of the four signals being modulated in phase only in dependence on the quadrature signal.

24. A system according to claim 23 wherein a sub-combination of the first pair of signals is a radio frequency signal modulated in amplitude according to the in-phase signal and a sub-combination of the second pair of signals is a radio frequency signal modulated in amplitude according to the quadrature signal, and the sub-combinations are in quadrature and combine to produce the radio frequency signal that is modulated in phase and amplitude with the information signal at the transmit power level.

25. A system according to claim 24 wherein the phases of the first pair of signals are modulated in a counter-rotating manner in dependence only on the in-phase signal and the phases of the second pair of signals are modulated in a counter-rotating manner in dependence only on the quadrature signal.

26. A system according to claim 22 wherein the means for separately amplifying comprises means for separately amplifying each of the more than two signals of constant amplitude and controlled phase in separate saturated amplifiers.

27. A system according to claim 22 wherein the means for combining comprises means for connecting the separately amplified signals in series with a load impedance such that the load impedance receives the sum of the voltages of the separately amplified signals.

28. A system according to claim 22 wherein the means for combining comprises means for connecting each of the separately amplified signals via a quarter wavelength transmission line or discrete component equivalent thereof to a single terminal of a load impedance such that the load impedance receives a signal current proportional to a sum of the separately amplified signals.

29. A system according to claim 28 wherein the discrete equivalent to the quarter wavelength lines comprises means for inductively connecting each of the separately amplified signals to the load terminal.

30. A system according to claim 28 wherein the more than two quarter wavelength transmission line equivalent networks are more than two Pi-networks comprising inductors and capacitors.

31. A system according to claim 30 wherein the capacitors include output capacitors that are combined in parallel.

32. A system according to claim 31 wherein the capacitors include input capacitors that include the output capacitance of the associated means for separately amplifying.

33. A system according to claim 22 wherein the means for modulating comprises means for phase modulating each of the more than two signals of constant amplitude in dependence on the in-phase and quadrature signals.

34. A system according to claim 22 wherein the means for modulating comprises means for quadrature modulating each of the more than two signals of constant amplitude in dependence on the in-phase and quadrature signals.

35. A system according to claim 22 wherein the means for modulating comprises using a separate phase locked loop to filter each of the more than two signals.

36. A system according to claim 23 further comprising:
means for generating a signal Q' complementary to the in-phase signal such that the sum of the squares of the in-phase signal and Q' is constant;
means for modulating a cosine signal at the radio carrier frequency with the in-phase signal and a sine signal with the Q' signal to produce a modulated cosine and a modulated sine signal;
means for forming the first pair of signals as the sum and the difference of the modulated cosine and modulated sine signal;
means for generating a signal I' complementary to the quadrature signal such that the sum of the squares of I' and the quadrature signal is constant;
means for modulating a cosine signal at the radio carrier frequency with the I' signal and a sine signal with the quadrature signal, to produce a modulated cosine and a modulated sine signal; and
means for forming the second pair of signals as the sum and the difference of the modulated cosine and modulated sine signals.

37. A system for generating a radio frequency signal at a desired transmit power level, the radio frequency signal being modulated in phase and amplitude with an information source signal, the system comprising:

a generator this is configured to generate from the information source signal a complex baseband signal representative of the phase and amplitude modulation, the complex baseband signal comprising an in-phase signal and a quadrature signal;

a modulator that is configured to modulate a radio carrier frequency using the in-phase and quadrature signals to produce more than two modulated radio frequency signals of constant amplitude and varying phase;

more than two amplifiers, a respective one of which is configured to separately amplify a respective one of the more than two modulated radio frequency signals; and a combining network that is configured to combine the more than two amplified modulated radio frequency signals to produce the desired radio frequency signal that is modulated in phase and amplitude with the information source signal at the desired transmit power level.

38. A system according to claim 37 wherein the more than two modulated radio frequency signals of constant amplitude and varying phase are four signals, a first pair of the four signals being modulated in phase only in dependence on the in-phase signal and the second pair of the four signals being modulated in phase only in dependence on the quadrature signal.

39. A system according to claim 38 wherein a sub-combination of the first pair of signals is a radio frequency signal modulated in amplitude according to the in-phase signal and a sub-combination of the second pair of signals is a radio frequency signal modulated in amplitude according to the quadrature signal, and the sub-combinations are in quadrature and combine to produce the radio frequency signals that are modulated in phase and amplitude with the information signal at the transmit power level.

40. A system according to claim 39 wherein the phases of the first pair of signals are modulated in a counter-rotating manner in dependence only on the in-phase signal and the phases of the second pair of signals are modulated in a counter-rotating manner in dependence only on the quadrature signal.

41. A system according to claim 37 wherein the more than two amplifiers are more than two saturated amplifiers.

42. A system according to claim 37 wherein the combining network comprises more than two transformers each having a primary winding and a secondary winding, a respective primary winding being coupled to a respective one of the more than two amplifiers, the secondary windings being series-coupled to produce the radio frequency signal.

43. A system according to claim 37 wherein the combining network comprises more than two quarter wavelength transmission lines or discrete component equivalents thereof, a respective one of which is connected between a respective one of the more than two amplifiers and a single terminal of a load impedance such that the load impedance receives a signal current proportional to a sum of the separately amplified signals.

44. A system according to claim 43 wherein the discrete equivalent to the quarter wavelength lines comprises an inductance that is configured to connect each of the separately amplified signals to the load terminal.

45. A system according to claim 43 wherein the more than two quarter wavelength transmission line equivalent networks are more than two Pi-networks comprising inductors and capacitors.

46. A system according to claim 45 wherein the capacitors include output capacitors that are combined in parallel.

47. A system according to claim 45 wherein the capacitors include input capacitors that include the output capacitance of the associated separate amplifiers.

48. A system according to claim 37 wherein the modulator comprises a phase modulator that is configured to modulate each of the more than two signals of constant amplitude in dependence on the in-phase and quadrature signals.

49. A system according to claim 37 wherein the modulator comprises a quadrature modulator that is configured to modulate each of the more than two signals of constant amplitude in dependence on the in-phase and quadrature signals.

50. A system according to claim 37 wherein the modulator comprises a separate phase locked loop to filter each of the more than two signals.

51. A system according to claim 38 further comprising:

a first generator that is configured to generate a signal Q' complementary to the in-phase signal such that the sum of the squares of the in-phase signal and Q' is constant;

a first modulator that is configured to modulate a cosine signal at the radio carrier frequency with the in-phase signal and a sine signal with the Q' signal to produce a modulated cosine and a modulated sine signal;

a first circuit that is configured to form the first pair of signals as the sum and the difference of the modulated cosine and modulated sine signal;

a second generator that is configured to generate a signal I' complementary to the quadrature signal such that the sum of the squares of I' and the quadrature signal is constant;

a second modulator that is configured to modulate a cosine signal at the radio carrier frequency with the I' signal and a sine signal with the quadrature signal, to produce a modulated cosine and a modulated sine signal; and a second circuit that is configured to form the second pair of signals as the sum and the difference of the modulated cosine and modulated sine signals.

* * * * *

UNITED STATES PATENT AND TRADEMARK OFFICE
CERTIFICATE OF CORRECTION

PATENT NO. : 6,311,046 B1  
DATED : October 30, 2001  
INVENTOR(S) : Paul Wilkinson Dent Page 1 of 1

It is certified that error appears in the above-identified patent and that said Letters Patent is hereby corrected as shown below:

Title page,
Item [56], References Cited, U.S. PATENT DOCUMENTS, insert the following references:

-- U.S. PATENT DOCUMENTS

| Patent No. | Date | Name | Class |
|---|---|---|---|
| 5,815,531 | 9/1998 | Dent | 375/298 |
| 5,638,024 | 6/1997 | Dent et al. | 330/84 |
| 5,631,604 | 5/1997 | Dent et al. | 330/124R |
| 5,574,967 | 11/1996 | Dent et al. | 344/12.1 |
| 5,568,088 | 10/1996 | Dent et al. | 330/151 |
| 5,420,541 | 5/1995 | Upton et al. | 330/286 |
| 2,210,028 | 8/1940 | Doherty | |
| 4,090,147 | 5/1978 | Seidel | 330/10 |
| 3,810,081 | 5/1974 | Stover | 325/30 |
| 5,541,554 | 7/1996 | Stenger et al. | 330/51 |
| 6,097,252 | 8/2000 | Sigmon et al. | 330/136 |
| 5,838,210 | 11/1998 | Midya et al. | 332/109 |
| 5,420,541 | 5/1995 | Upton et al. | 330/286 |
| 6,085,074 | 7/2000 | Cygan | 455/241.1 |
| 5,917,384 | 6/1999 | Chethik et al. | 332/103 |
| 5,175,871 | 12/1992 | Kunkel | 455/69 |

OTHER DOCUMENTS

Chireix, "High Power Outphasing Modulation," Proceedings of the Institute of Radio Engineers, Vol. 23, No. 11, November 1935, pp. 1370-1392

Morais et al., "NLA-QAM: A Method for Generating High-Power QAM Signals Through Nonlinear Amplification," IEEE Transactions on Communications, Vol. Com-30, No. 3, March 1982, pp. 517-522

Signed and Sealed this

Twentieth Day of July, 2004

JON W. DUDAS  
*Acting Director of the United States Patent and Trademark Office*